US008774576B2

(12) United States Patent
Shiraishi

(10) Patent No.: US 8,774,576 B2
(45) Date of Patent: Jul. 8, 2014

(54) OPTICAL MODULE AND METHOD FOR MANUFACTURING THE SAME

(75) Inventor: Takashi Shiraishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 153 days.

(21) Appl. No.: 13/215,746

(22) Filed: Aug. 23, 2011

(65) Prior Publication Data

US 2012/0076454 A1    Mar. 29, 2012

(30) Foreign Application Priority Data

Sep. 24, 2010    (JP) .................. 2010-214493

(51) Int. Cl.
*G02B 6/12*    (2006.01)
*G02B 6/32*    (2006.01)
*H05K 1/02*    (2006.01)
*H05K 1/18*    (2006.01)
*G02B 6/42*    (2006.01)
*H05K 1/14*    (2006.01)

(52) U.S. Cl.
CPC ............ *H05K 1/0274* (2013.01); *G02B 6/4246* (2013.01); *G02B 6/4281* (2013.01); *G02B 6/42* (2013.01); *H05K 2201/10121* (2013.01); *G02B 6/4214* (2013.01); *G02B 6/4249* (2013.01); *H05K 1/147* (2013.01); *G02B 6/4224* (2013.01); *H05K 2201/09918* (2013.01); *G02B 6/4206* (2013.01); *H05K 2203/166* (2013.01); *H05K 1/189* (2013.01)
USPC .............................................. 385/33; 385/14

(58) Field of Classification Search
USPC ....................................................... 385/14, 33
See application file for complete search history.

(56) References Cited

U.S. PATENT DOCUMENTS

| 6,091,479 | A  | * | 7/2000  | Frosig et al. ................... 355/22 |
| 2004/0130785 | A1 | * | 7/2004 | Yun et al. ....................... 359/565 |
| 2004/0160676 | A1 |   | 8/2004 | Kaneko et al. |
| 2005/0074954 | A1 | * | 4/2005 | Yamanaka ..................... 438/458 |
| 2006/0263003 | A1 | * | 11/2006 | Asai et al. ........................ 385/14 |
| 2010/0245997 | A1 | * | 9/2010 | Shinohara et al. ............. 359/463 |

FOREIGN PATENT DOCUMENTS

| JP | 2001-141965 | 5/2001 |
| JP | 2004-241630 | 8/2004 |
| JP | 2006-284781 | 10/2006 |

* cited by examiner

*Primary Examiner* — Jerry Blevins
(74) *Attorney, Agent, or Firm* — Staas & Halsey LLP

(57) ABSTRACT

A an optical module includes a circuit board provided with an optical element selected from a light-receiving element and/or a light-emitting element; a lens where light from the optical element passes through; an alignment mark serving as an indicator for alignment with the optical element; and an optical waveguide formed to input/output light into/from the optical element through the lens.

24 Claims, 31 Drawing Sheets

OPTICAL MODULE AND METHOD FOR MANUFACTURING THE SAME

CROSS-REFERENCE TO RELATED APPLICATION

This application is based upon and claims the benefit of priority of the prior Japanese Patent Application No. 2010-214493, filed on Sep. 24, 2010, the entire contents of which are incorporated herein by reference.

FIELD

The present invention relates to an optical module and a method for manufacturing the optical module.

BACKGROUND

In recent years, in the field of servers and high-performance computers, an improvement in performance causes increased transmission capacity of I/O functions that allow a CPU and an external interface to communicate with each other. On the other hand, an optical interconnect technology that enables high-capacity transmission with optical signals by arrangement of a photoelectric conversion element has been considered in the field of a conventional high-speed transmission using electricity from the viewpoint of cross talk or wiring density.

In the optical interconnect technology, a small-sized optical module is smaller and more cost effective in production than that of a conventional infrastructural optical communication. For example, this kind of optical module, which has been known in the art, is one in which an optical element, such as a light-emitting element or a light-receiving element, is mounted face-down on a circuit board containing a transparent material and an optical waveguide is arranged on the surface thereof opposite the surface on which the optical element is mounted.

This kind of optical module is designed to be manufactured at lower cost. Thus, an optical module, where an optical transmission element is mounted on a transparent FPC substrate comprised of a thin film made of polyimide or the like, has been known. For example, the above optical module is placed on a printed circuit board in a server through an electric connector, so that a high-speed transmittable optical communication may be realized at low cost.

In the field of an optical interconnect technology, high-speed optical transmission of more than 20 GBps has been increasingly desired. Therefore, a light-emitting element which is operable at high speed, and an optical module on which a light-receiving element is mounted have been used. In the aforementioned optical module, however, a large coupling loss of optical signals has been observed between the light-emitting element or a light-receiving element and the optical waveguide.

Specifically, the aperture of the light-emitting part or light-receiving part of the optical element is not always equal to an input aperture or output aperture of the optical waveguide. The larger the difference between the apertures, the more signal light beams are emitted outside. Thus, coupling loss increases. In particular, the aperture of the light receiving surface (light receiving surface area) becomes small as the light-receiving element is operated at higher speed. To drive the light reception element at higher speed, the stray capacity of the light-receiving element is preferably set lower. Thus, it is preferable to make the aperture of the light receiving surface smaller. For example, it is preferable to make the aperture of the light receiving surface less than 50 μm if the light-receiving element is desired to be operated at 20 GBps or more.

On the other hand, an optical waveguide has an outlet aperture of about 50 μm in general when a cost-effective multimode waveguide is used. Therefore, considering the spread of emitting beams from the multimode waveguide, the optical waveguide may cause an optical loss of about 2 to 3 dB. Even in the case where an optical element is a light-emitting element, it is preferable to thicken a substrate in order to respond to high frequencies. Some emitting beams have difficulty coupling with the optical waveguide when the substrate is thickened, leading to an optical decrease of about 0.5 to 1 dB.

To prevent this kind of optical loss, a configuration of an optical element in which a microlens is formed on the light receiving surface of a light-receiving element by using a dispenser to integrally form a light-receiving element and a lens are integrally formed (see, for example, Japanese Laid-open Patent Publication No. 2004-241630); a method for integrally forming a concave mirror on a 45-degree mirror portion of a waveguide (for example, Japanese Laid-open Patent Publication No. 2001-141965); and a method for inserting a lens into an opening drilled in a printed circuit board (see, for example, Japanese Laid-open Patent Publication No. 2006-284781).

SUMMARY

According to an aspect of the embodiment, an optical module includes a circuit board provided with one or more optical elements selected from a light-receiving element and/or a light-emitting element. A lens sheet can be formed and made of a transparent material; and a lens formed on a part of the lens sheet, where light from the optical element passes through the part of the lens sheet. An alignment mark serves as an indicator for alignment with the optical element; and an optical waveguide is provided for inputting/outputting light into/from the optical element through the lens.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, preferable embodiments of disclosed technologies will be described in detail with reference to the attached drawings.

Figure 1A:
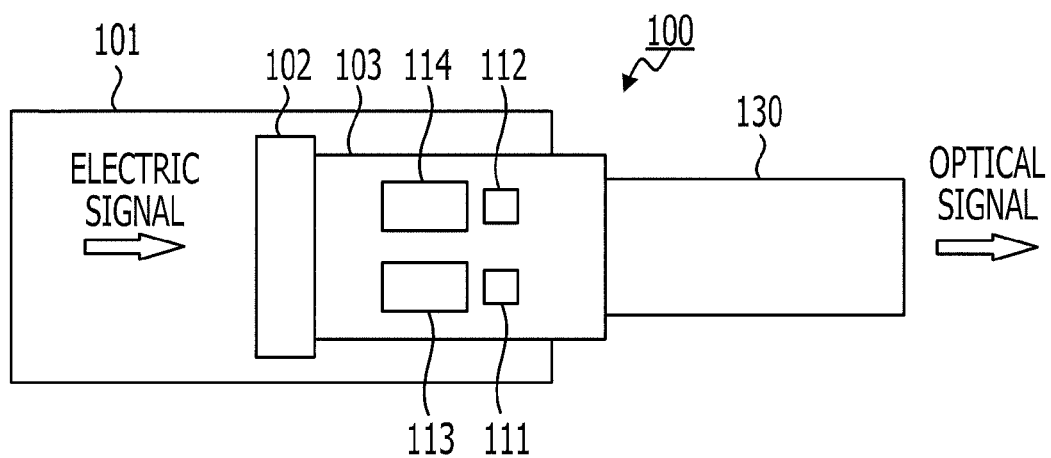
FIG. 1A and FIG. 1B are diagrams each illustrating an exemplary optical module according to a first embodiment.
Figure 1B:
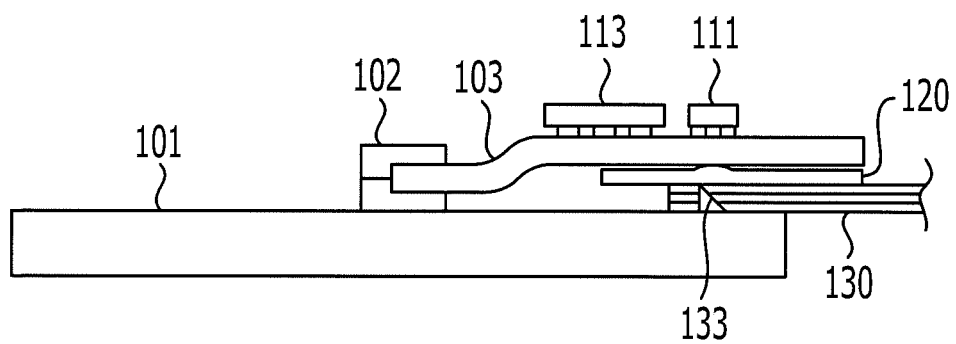

FIG. 1A and FIG. 1B are diagrams each illustrating an exemplary optical module according to a first embodiment.

Specifically, FIG. 1A is a front view of the optical module and FIG. 1B is a side view of the optical module illustrated in FIG. 1A. The optical module 100 includes a printed circuit board 101 for transmitting electric signals and a circuit board 103 which is coupled to the printed circuit board 101 through an electric connector 102. The circuit board 103 is, for example, a flexible printed circuit board (FPC) having flexibility on which wiring conductors are patterned at least on the upper surface thereof. The circuit board 103 is made of a transparent material, such as polyimide, having a small loss of electric signals at high frequencies.

A light-receiving element 111 and a light-emitting element 112 are mounted face-down on the top surface of the circuit board 103. An optical module 100 is configured by mounting at least one of (one or more of) the light-receiving element 111 and/or the light-emitting element 112. The face-down mounting of the light-receiving element 111 and the light-emitting element 112 is realizable by a common element-mounting process such as a flip-chip bonding process. The light-emitting element 112 may be a vertical cavity semiconductor emission laser (VCSEL) array and the light-receiving element 111 may be a photo diode (PD) array.

A trans impedance amplifier (TIA) 113 is coupled to and arranged in the vicinity of the light-receiving element 111 on the circuit board 103. The TIA 113 converts an electric current from the light-receiving element 111 to a voltage. A drive IC 114 for driving the light-emitting element 112 is coupled to and arranged in the vicinity of the light-emitting element 112. The TIA 113 and the drive IC 114 are electrically coupled to the printed circuit board 101 through the electric connector 102 from the flexible printed circuit board 103.

A lens sheet 120 is attached to the back surface (facing away from an optical element) of the circuit board 103. The lens sheet 120 is made of a transparent material and partially formed of a light-collecting lens.

An optical waveguide 130 for transmitting signal light beams is coupled to the under surface (facing away from an optical element) of the lens sheet 120. The optical waveguide 130 guides light incident on the light-receiving element 111 or light output from the light-emitting element 112. The optical waveguide 130 is provided with a mirror 133 for bending a light path at desired degrees, for example, at 90 degrees, to cause optical coupling between the light-receiving element 111 and the light-emitting element 112.

Figure 2:
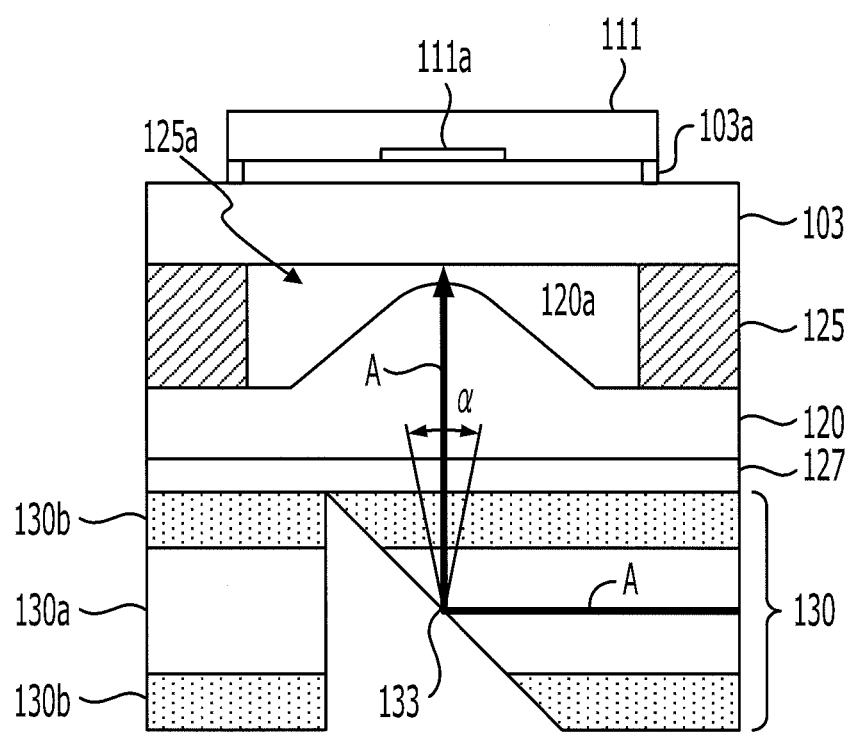
FIG. 2 is a partially expanded sectional view of the optical module according to the first embodiment.

FIG. 2 is a partially expanded sectional view of the optical module according to the first embodiment. The light-receiving element is illustrated in FIG. 2. The optical waveguide 130 is a polymer waveguide. The optical waveguide 130 transmits a signal light beam to the circuit board 103 and makes the circuit board 103 produce an output signal light beam. The optical waveguide 130 includes a center core 130a and a clad 130b which is arranged around the core 130a. The clad 130b has a refractive index lower than that of the core 130a. Thus, a signal light beam in the core 130a is transmitted while totally reflecting on the interface between the core 130a and the clad 130b.

A light-collecting lens 120a is formed on the lens sheet 120. The lens illustrated in FIG. 2 is a convex lens having a predetermined height. Thus, an adhesive sheet 125 having a height corresponding to the height of the lens 120a is placed between the circuit board 103 and the lens sheet 120 to attach them together. An opening part 130a is previously formed at a part of a light path A where a signal light beam passes through. Instead of the adhesion sheet 125, a spacer having a predetermined height and an adhesive agent may be used. The lens sheet 120 is transparent and made of a thermoplastic resin such as cycloolefin polymer (COP) or polycarbonate (PC).

As an optical wavelength 130, for example, a polymer waveguide containing epoxy resin or acrylate resin may be used. A multimode-propagation waveguide is cost effective and generally used for the optical waveguide 130. However, it is not limited to this kind of waveguide. The optical waveguide 130 is attached on the under surface of the lens sheet 120 through a transparent adhesion layer 127. The adhesion layer 127 may be a transparent adhesion sheet as in the case of the adhesion sheet 125.

The optical waveguide 130 is provided with a mirror so that the mirror 133 is located at a position on the lower part of the optical waveguide 130 and corresponds to the arrangement of the light-receiving element 111. The mirror 133 is formed by dicing or cutting the optical waveguide 130 by laser machining. The inclined angle of the mirror 133 is, for example, 45 degrees. Thus, the mirror 133 is able to reflect the signal light beam transmitted through the optical waveguide 130 to the circuit board 103.

The light-receiving element 111 includes a light receiving surface 111a that faces the circuit board 103 and receives the signal light beam passed through the circuit board 103. The light-receiving element 111 converts the signal light beam into a signal current. The light-receiving element 111 is, for example, a photo diode (PD). The light receiving surface 111a is in the form of, for example, a round shape. The light-receiving element 111 has a function of transmitting signal current from electrodes (a signal electrode 103a and an earth electrode) coupled thereto. These electrodes are not transparent so that they are wired so as to avoid a region of a light path A through which a signal light beam passes. In the above description, the earth electrode (not illustrated in the figure) is arranged in parallel with the signal electrode 103a or arranged on the entire surface opposite the light-receiving element 111 of the circuit board 103. In the case of forming the earth electrode on the entire surface opposite the light-receiving element 111 of the circuit board 103, an opening is formed on the part of the light path A through which a signal light beam passes.

Exemplary dimensions of each part will be described. Here, the thickness of (in the height direction in the figure) the light-receiving element 111 is 200 μm. The circuit board 103 is, for example, not more than 25 μm in thickness, which corresponds to the thickness of a common FPC substrate. The signal electrode 103a and the earth electrode are not more than 20 μm in thickness. The lens sheet 120 has an overall thickness of not more than 300 μm. A flat portion other than the area on which the lens 120a is formed has a thickness of, for example, 50 μm. The portion on which the lens 120a is formed has a thickness of not more than 50 μm. The thickness of the adhesion sheet 125 is, for example, 50 μm which corresponds to the height of the lens 120a. The adhesion layer 127 is, for example, not more than 10 μm in thickness. The optical waveguide 130 is, for example, not more than 100 μm in overall thickness. The light receiver 111a is, for example, about 30 μm in thickness.

According to the above configuration, as represented by a light path (optical axis) A in the figure, a signal light beam which has passed through and been output from the optical waveguide 130, is reflected at an angle of 45 degrees on a mirror 133 and output to the light-receiving element 111. The light beam refracted by the mirror 133 and having a spread angle $\alpha$ can be concentrated on the light receiving surface 111a of the light-receiving element 111 by the lens 120a. Therefore, the diffusion of the signal light beam output from the optical waveguide 130 may be prevented and the beam can be concentrated on the light receiving surface 111a.

FIGS. 3A to 3D are diagrams each illustrating an exemplary process for producing an optical module according to the first embodiment. From a viewpoint of production of an optical module, the most important matter is to precisely align the light-receiving element 111 and the lens 120a of the lens sheet 120. Unless the light-receiving element 111 and the lens 120a of the lens sheet 120 are aligned with an accuracy of about ±10 μm, good optical coupling is difficult to attain.

Figure 3A:
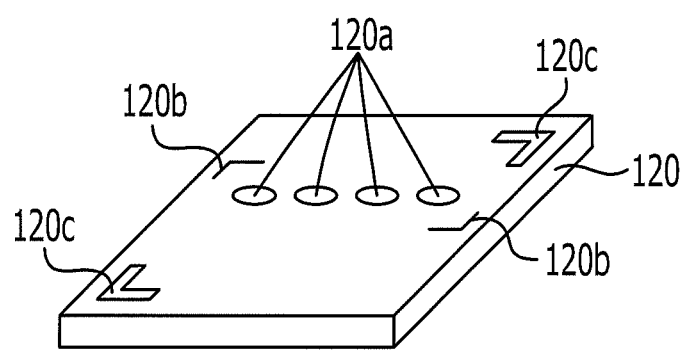
FIGS. 3A to 3D are diagrams each illustrating an exemplary process for manufacturing the optical module according to the first embodiment.

Therefore, as illustrated in FIG. 3A, alignment marks 120b are formed on the lens sheet 120 together with the lens 120a. The alignment marks 120b are precisely positioned with respect to the position of the lens 120a. The alignment marks 120b are formed as convex or concave portions on the surface of the lens sheet 120. Viewed from the upper surface, each alignment mark 120b is in the form of a generally angled bracket. To form the lens 120a and the alignment marks 120b on the lens sheet 120, an imprint method for heating and compressing a die in which the shapes of the lens 120a and the alignment mark 120b are dug may be used.

Alternatively, an emboss roll method may be used. In this method, the lens 120a and the alignment mark 120b are dug into the metal on a roll, and thermoplastic resin is placed in the roll at high temperature. Alternatively, for example, an in-print method may be used. In this method, UV-curing resin is applied to a transparent film and cured after pressing the film by a die.

The alignment marks 120b are, for example, marks that represent positions corresponding to the outward form of the housing of an optical element to be mounted on the circuit board 103. The alignment marks 120b may be formed on positions corresponding to four corners of the outer diameter of the housing of the optical element in a rectangular shape. Alternatively, for example, as illustrated in FIG. 3A, the alignment marks 120b may be formed on positions corresponding to two corners of the housing of the optical element. In addition to forming the optical element with only the aforementioned light-receiving element 111, the optical element may be integrally comprised of the light-receiving element 111 and the light-emitting element 112. The number of alignment marks 120b may be determined depending on the number of optical elements to be mounted. Two alignment marks 120b may be formed when only one housing of the optical element is present. When two housings of the optical elements are present, the alignment marks 120b may be formed at four different positions (2×2=4). FIG. 3A illustrates the example of the housing of one optical element (for example, only the light-receiving element 111).

As illustrated in FIG. 3A, the lens sheet 120 may include a plurality of lenses 120a which are integrally formed, while a corresponding optical element may include a plurality of channels (ch). For example, in case of two light-receiving elements 111 and two light-emitting elements 112 (2 ch) formed, as illustrated in FIG. 3A, two of four lenses 120 are provided for two light-receiving elements 111 and the remaining two are provided for the light-emitting element 112.

Attachment markers 120c for alignment of the circuit board 103 may be also formed on the lens sheet 120. The attachment markers 120c may be uneven portions as in the case of the alignment marks 120b or may be formed by printing.

Figure 3B:
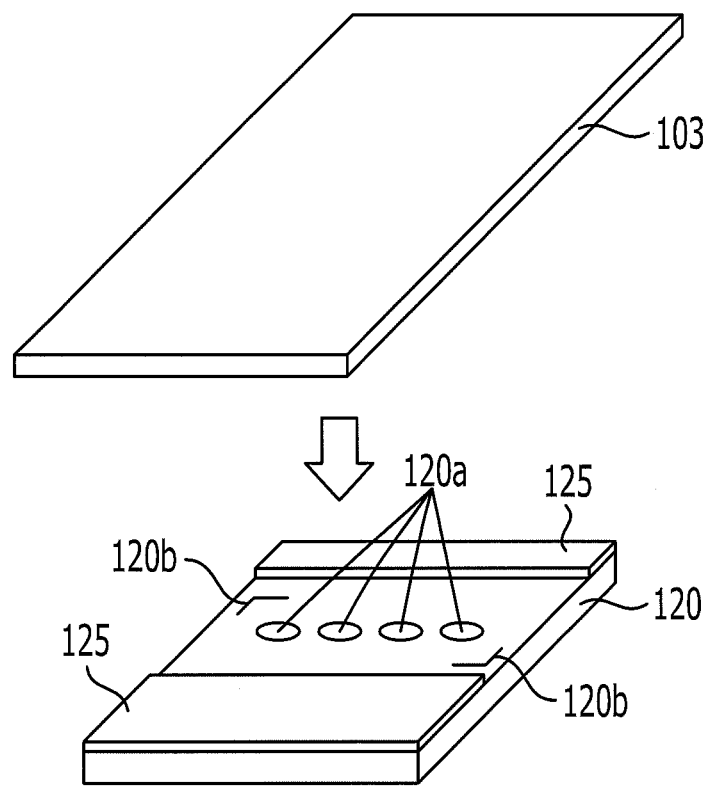

Next, as illustrated in FIG. 3B, an adhesion sheet 125 is formed on the lens sheet 120. Then, the circuit board 103 is attached on the lens sheet 120 through the adhesion sheet 125. At the time of attachment, the lens sheet 120 and the circuit board 103 may be aligned with each other using the attachment device with reference to the attachment markers 120c.

Figure 3C:
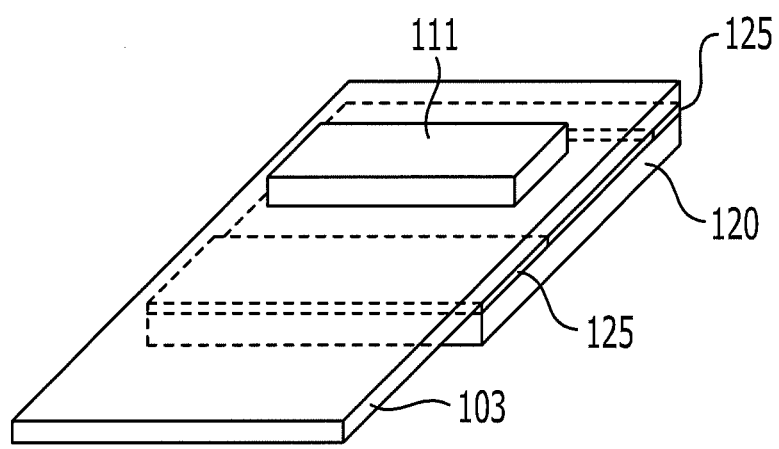

Next, as illustrated in FIG. 3C, flip-chip bonding is performed while positioning the optical element (for example, the housing of the optical-light receiving element 111) on the lens sheet 120 so that the alignment marks 120b formed on the lens sheet 120 are aligned with the outer form of the optical element.

Figure 3D:
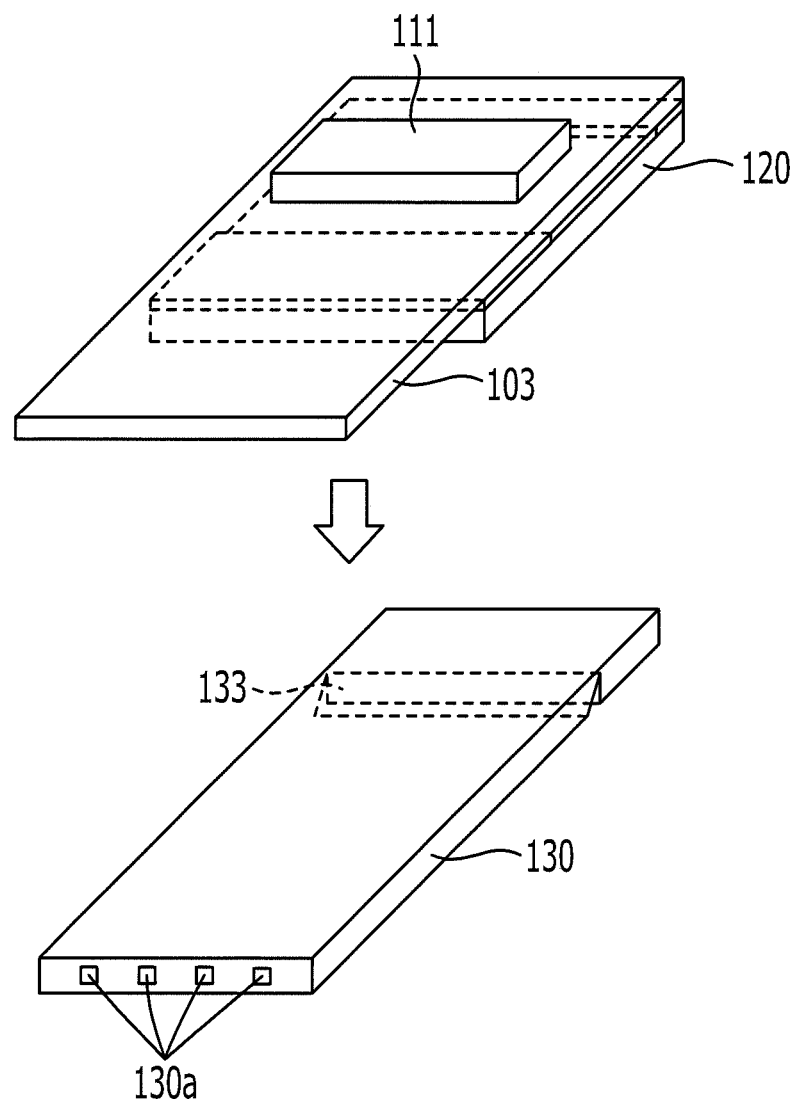

Then, as illustrated in FIG. 3D, the optical waveguide 130 may be attached on the under surface of the lens sheet 120 by adhesion. Here, as illustrated in FIG. 2, the attachment is performed so that the position of the mirror 133 corresponds to the position of the lens 120a. For convenience, in the optical waveguide 130, cores 130a through which signal light beams are guided are illustrated.

The number of the cores 130a corresponds to the number of lenses 120a.

Among the manufacturing steps described above, the alignment of the respective portions will be described. FIGS. 4A to 4K are diagrams each illustrating the structure of alignment. These figures illustrate an example in which a 4-ch light-emitting element 112 (VCSEL array) and light-receiving element (111) (PD array) are mounted.

Figure 4A:
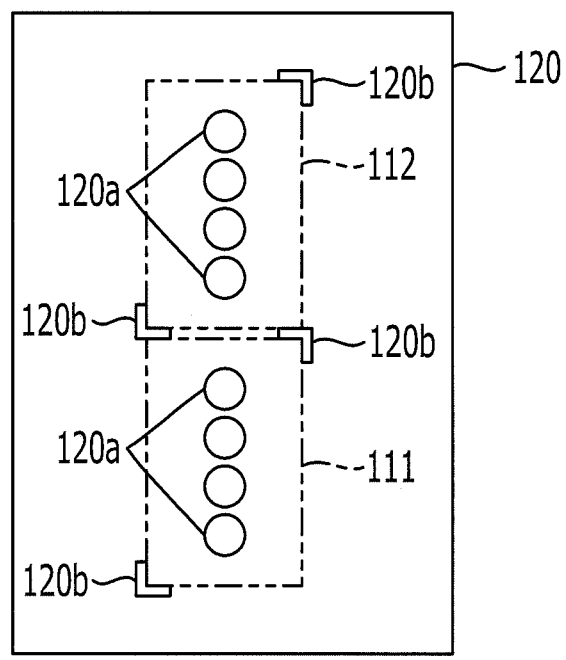
FIG. 4A and FIG. 4B are diagrams illustrating an exemplary lens sheet.
Figure 4B:
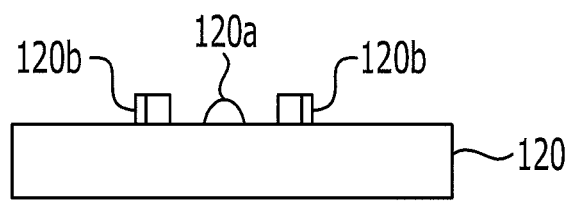

FIGS. 4A and 4B are diagrams each illustrating an exemplary lens sheet. FIG. 4A is a plan view of the lens sheet and FIG. 4B is a side view of the lens sheet. When the lens sheet 120 is in-print-formed, the alignment marks 120b may be formed into L-shaped convex portions. In the figure, chain lines represent the outer positions of the housings of the light-receiving element 111 and the light-emitting element 112. For each of the housing outer forms of the light-receiving element 111 and the light-emitting element 112, at least two alignment marks 120b are formed. The alignment marks 120b can be simultaneously formed with the lens 120a. Since an in-print die can be manufactured with a high accuracy of ±10 μm or less, the lens 120a and the alignment marks 120b are formed with high positional accuracy.

Figure 4C:
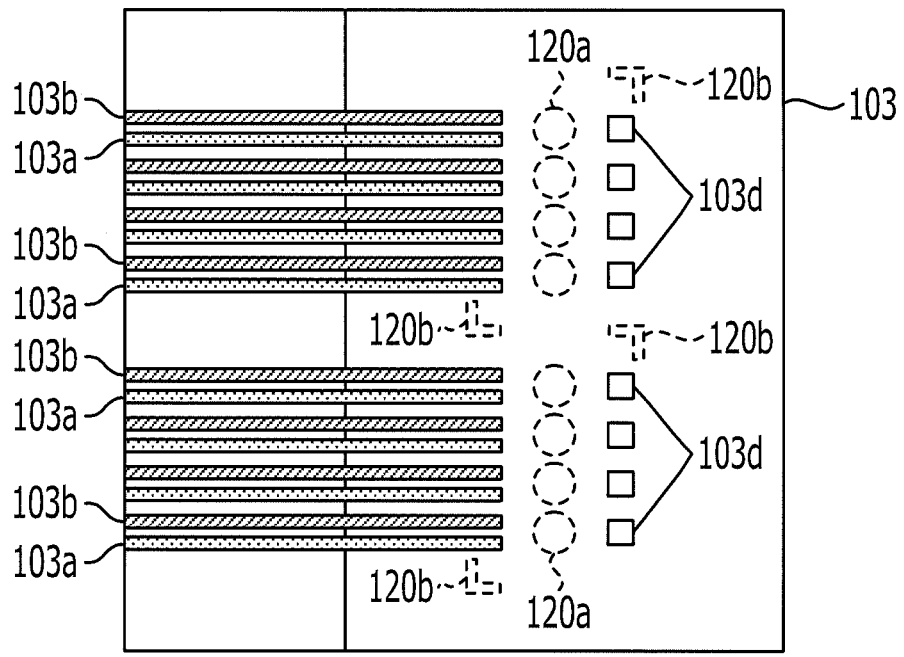
FIG. 4C and FIG. 4D are plan view and a cross-sectional view each illustrating a state where a circuit board is attached on a lens sheet.
Figure 4D:
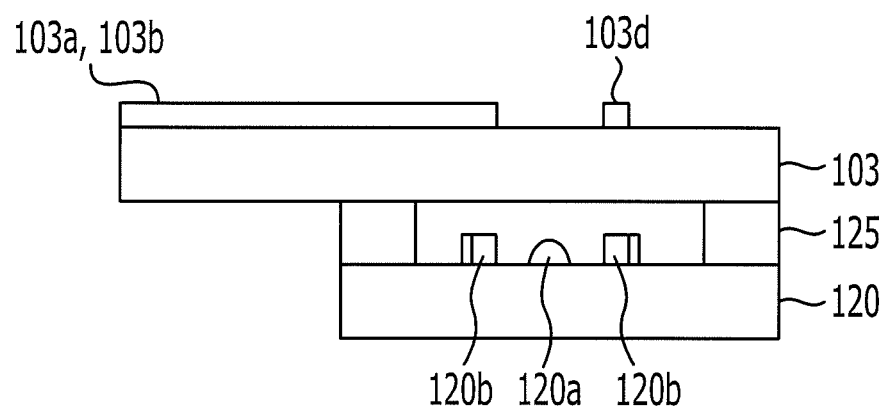

FIGS. 4C and 4D are diagrams illustrating a state where a circuit board is attached on the lens sheet. FIG. 4C is a plan view illustrating the state where the circuit board is attached onto the lens sheet and FIG. 4D is a cross-sectional view illustrating the same. As illustrated in FIGS. 4C and 4D, a signal electrode (anode electrode) 103a and an earth electrode (cathode terminal) 103b are formed on the upper surface of the circuit board 103. Electrode pads 103d are formed for the light-receiving element 111 and the light-emitting element 112. The electrode pads 103d are coupled to signal electrodes 103a and earth electrodes 103b.

Subsequently, the circuit board 103 made of transparent FPC is attached onto the lens sheet 120 through the adhesion sheet 125.

Figure 4E:
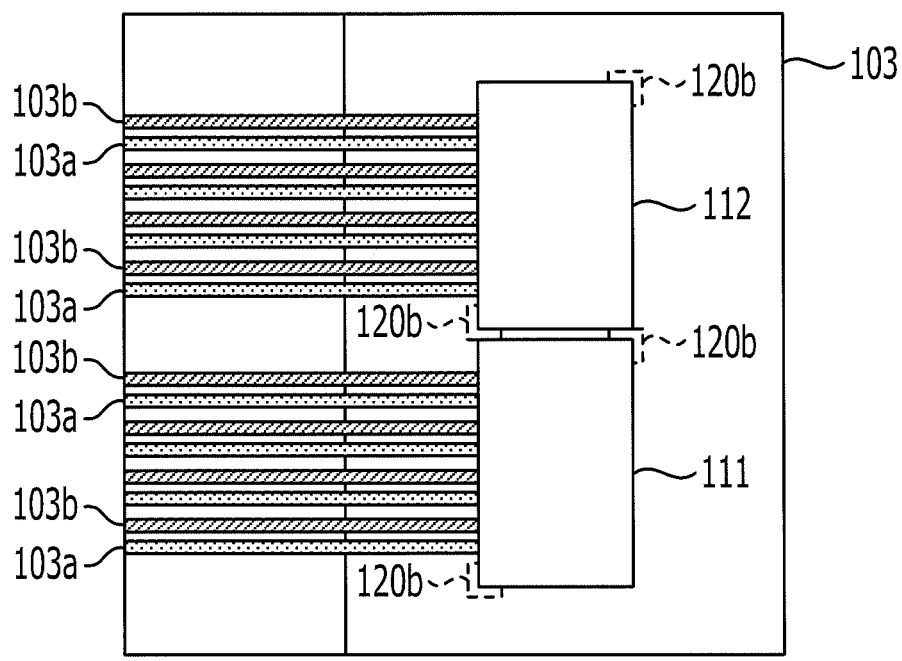
FIG. 4E and FIG. 4F are diagrams each illustrating a state of mounting an optical element.
Figure 4F:
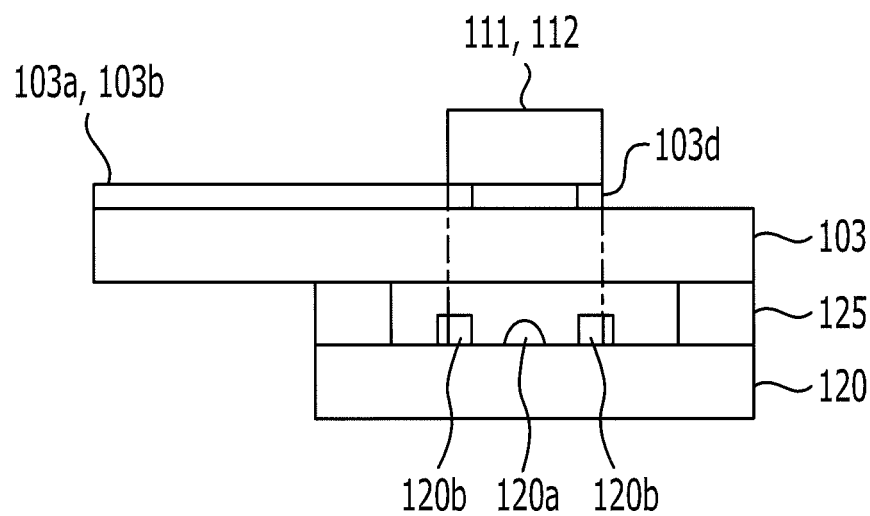

FIG. 4E is a plan view illustrating a state of mounting the optical element. FIG. 4F is a side view illustrating a state of mounting the optical element. While performing an image recognition, a device or apparatus, for example, a flip-chip bonder, is employed to mount the optical elements, the light-receiving element 111 and the light-emitting element 112, on the lens sheet 120 so that the outer forms of the housings of the respective optical elements are aligned to the positions of alignment marks 120b formed on the lens sheet 120 (positions represented by the dashed lines in the figure). In this case, since the circuit board 103 is transparent, the positions of the alignment marks 120b located on the lower surface of the circuit board 103 may be recognized via image recognition from the upper surface of the circuit board 103.

Figure 4G:
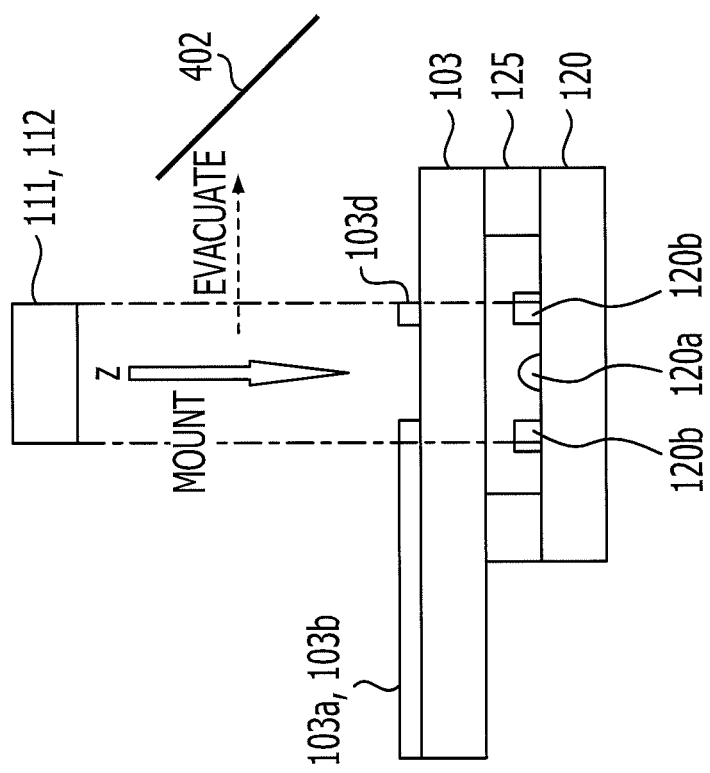
FIG. 4G and FIG. 4H are diagrams each illustrating exemplary flip-chip bonding.

FIG. 4G is a diagram illustrating an example of flip-chip bonding. The flip-chip bonder is equipped with a microscope 401, which is extendable in the horizontal direction (x, y) in the figure, and a half mirror 402. As illustrated in FIG. 4G, the half mirror 402 is placed between the circuit board 103 and the optical elements (light-receiving element 111 and light-emitting element 112). Thus, the positions of the circuit board 103 and the optical elements may be recognized by image recognition with the microscope 401. The resulting image represents a displacement of the optical elements (light-receiving element 111 and light-emitting element 112) in the horizontal direction (x, y) from the positions of the alignment marks 120b formed on the circuit board 103. Thus, using the reflected imagery positions of alignment marks 120b formed on the circuit board 103 as a standard (a reference mark or point), the optical elements (light-receiving element 111 and the light-emitting element 112) are moved (aligned) as much as a displacement amount in the horizontal direction (x, y) to be placed at the correct mounting position.

Figure 4H:
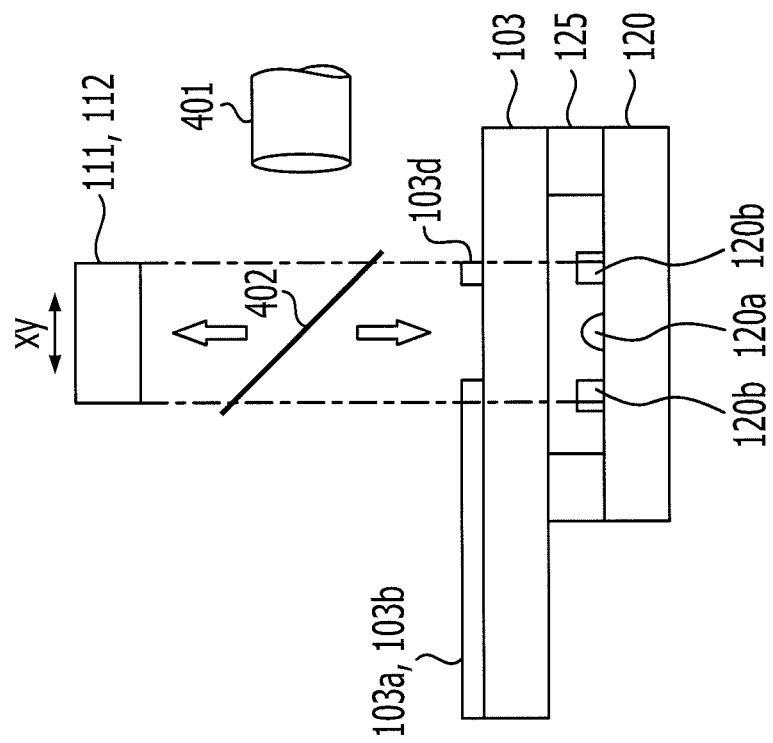

Subsequently, as illustrated in FIG. 4H, the half mirror 402 is retracted. Then, the optical elements (light-receiving element 111 and the light emitting device 112) are moved in the height direction (z) and mounted on a mounting position on the circuit board 103.

Figure 4I:
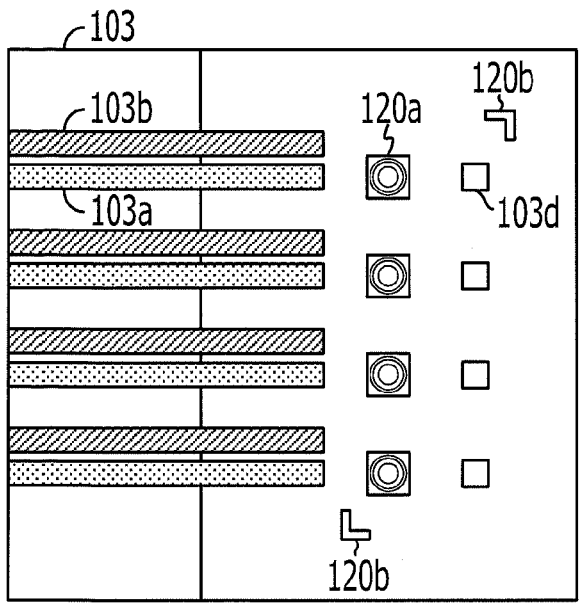
FIGS. 4I to 4K are diagrams each illustrating another exemplary flip-chip bonding.
Figure 4J:
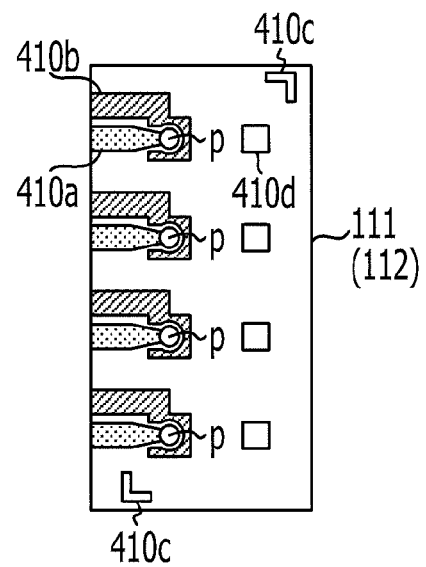
Figure 4K:
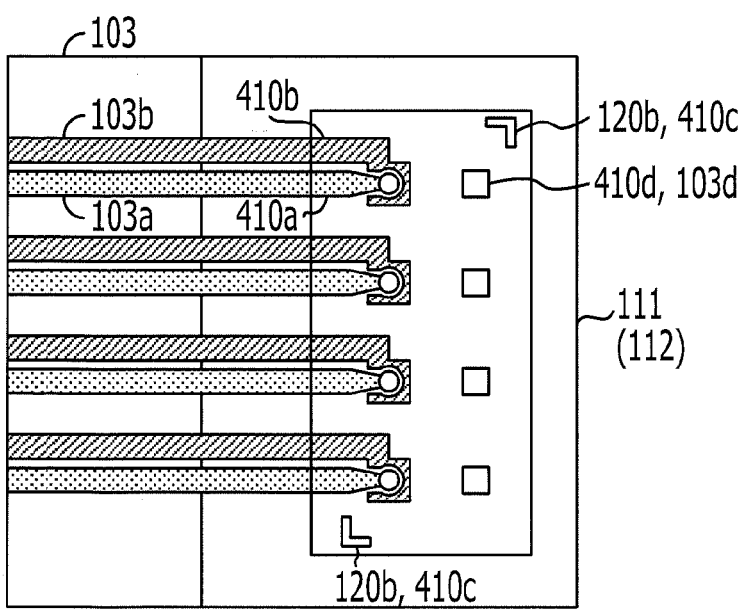

FIGS. 4I to 4K are diagrams each illustrating another exemplary flip-chip bonding. In this example, as illustrated in the plan view of FIG. 4I, alignment marks 120b are formed on a lens sheet 120 in advance. FIG. 4J is a diagram illustrating the under surface of the optical elements, a light-receiving element 111 or a light-emitting element 112, transparently viewed from the upper surface thereof. As illustrated in FIG. 4J, marker electrodes 410c are formed on the lower surface (electrode surface) of the optical element in advance. The marker electrodes 410c function as markers in the same way as the alignment marks 120b. The marker electrodes 410c can be simultaneously formed when pattern-forming each of the electrodes, the signal electrodes 410a and 410d and the earth electrode 410b, of the optical element.

The marker electrode 410c is formed to have the same profile as that of the alignment mark 120b. The marker electrodes 410c are aligned with respect to the center position ("p" in the figure) of the light-receiving element 111 or the light emitting device 112. In other words, it is aligned with respect to the center position of the light receiving surface of a light receiving chip in the light-receiving element 111 and the light emitting surface of a light emitting chip in the light emitting device 112.

As illustrated in FIG. 4K, like the above description, the alignment is performed using the flip-chip bonder provided with the microscope 401 and the half mirror 402. When performing the alignment, a displacement of the marker electrodes 410c in the horizontal direction (x, y), which are formed on the optical element (light-receiving element 111 or the light emitting element 112) with respect to the alignment marks 120b formed on the circuit board 103, is measured. Thus, using the positions of alignment marks 120b formed on the circuit board 103 as a standard, the optical elements (light-receiving element 111 and the light-emitting element 112) are moved as much as the displacement amount in the horizontal direction (x, y). When the positions of the alignment marks 120 and the positions of the marker electrodes 410c conform to each other, exact mounting positions are ensured and the alignment may be performed. Thus, the optical element (light-receiving element 111 or light-emitting element 112) may be precisely mounted on the circuit board 103. According to this method, the positional accuracy of the electrode formed on a semiconductor device, the light-receiving element 111 or the light-emitting element 112, is not more than one micrometer. Thus, the marker electrodes 410c may be used for forming with the same accuracy as that of the light-receiving element 111 or the light-emitting element 112 and the positioning accuracy at the time of mounting may be further improved.

Figure 5A:
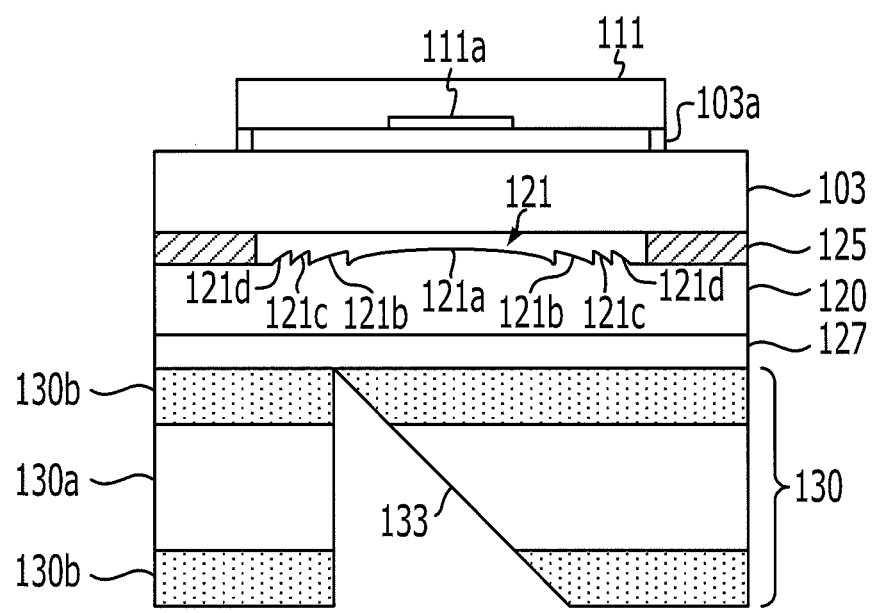
FIG. 5A is a partially expanded sectional view of an optical module according to a second embodiment.
Figure 5B:
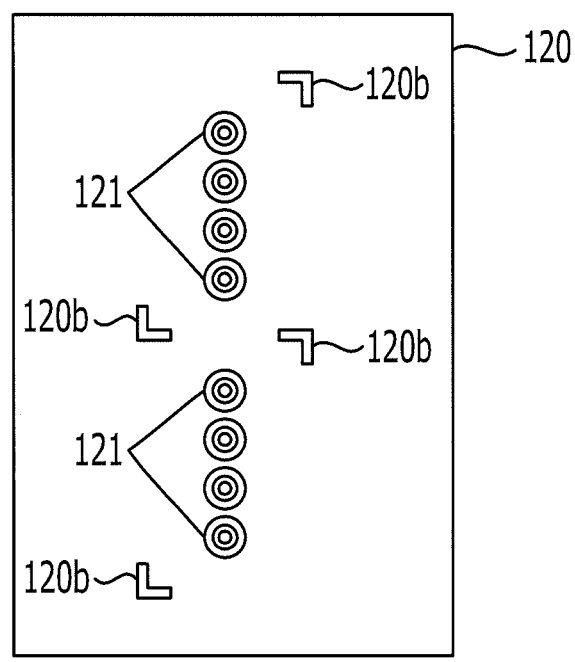
FIG. 5B is a plan view illustrating a lens sheet used for the optical module according to the second embodiment.

FIG. 5A is a partially expanded sectional view of an optical module according to a second embodiment. FIG. 5B is a plan view illustrating a lens sheet used for the optical module according to the second embodiment. The same reference numerals denote the same structural components as those illustrated in FIG. 2. In second embodiment, a Fresnel lens 121 is used as a lens on the lens sheet 120. The Fresnel lens 121 is a lens divided into a plurality of Fresnel zones. As illustrated in the figure, there are four zones, from the central first zone 121a to the outermost fourth zone 121d. Stepped boundaries are provided for the zones 121a to 121d, respectively.

The use of the Fresnel lens 121 shortens a focal length while making the lens thin. Besides, the Fresnel lens 121 increases a light collecting effect and improves optical coupling characteristics. Simultaneously, since the thickness of the lens is small, the thickness of the adhesion sheet 125 may be made thin. A single mode beam may be condensed to near the analytical limit. Thus, the use of the Fresnel lens 121 affects a beam incident on a back cut zone, so that a light-condensed spot may become large compared with the aforementioned usual lens 120a. On the other hand, a multimode beam has a large light-condensing spot, so that there may be very lithe effect even in the case of using the Fresnel lens 121.

Figure 6A:
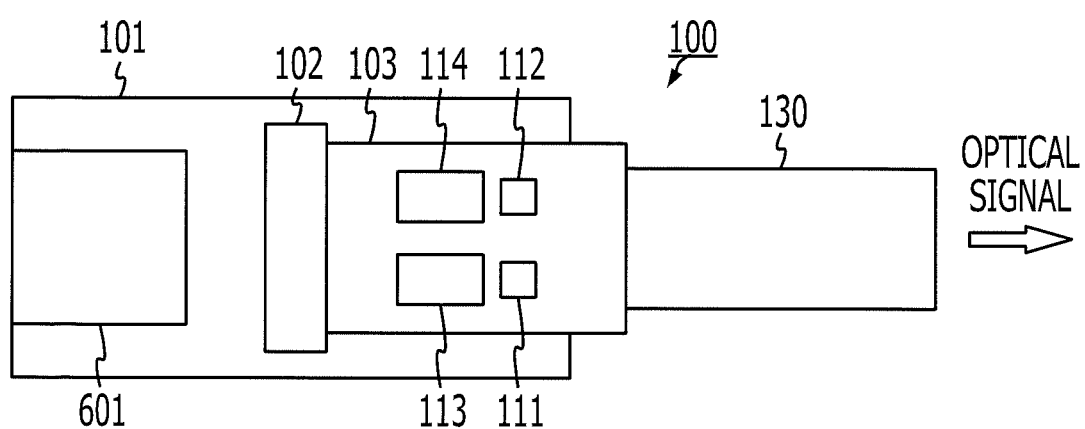
FIG. 6A is a plan view illustrating the entire configuration of the optical module according to the second embodiment.
Figure 6B:
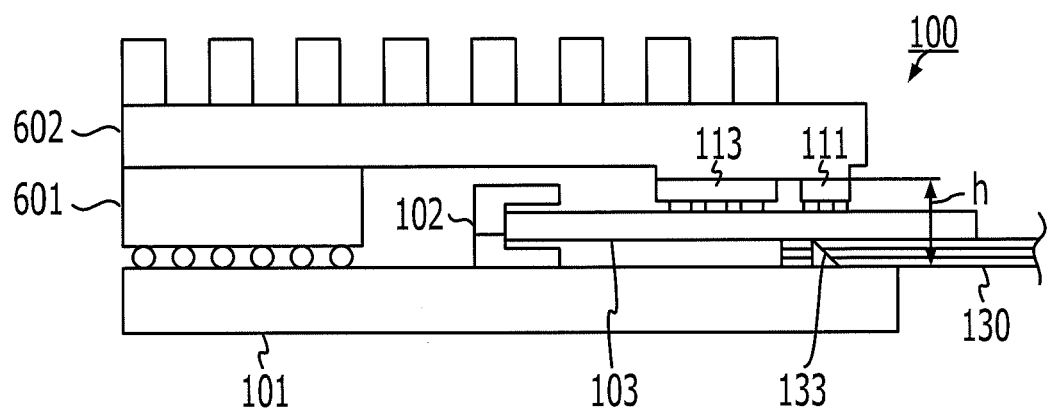
FIG. 6B is a side view of the optical module according to FIG. 6A.

FIG. 6A is a plan view illustrating the entire configuration of the optical module according to the second embodiment. FIG. 6B is a side view of the optical module according to FIG. 6A. The thickness of the second embodiment will be described using these figures. According to the configuration of the second embodiment, the thickness of an optical module 100 may be made thin.

The optical module 100 is housed in a server board which is not illustrated in the figures. Preferably, the optical module 100 used in the server may have as small an overall thickness as possible because of a small housing space in the server. As illustrated in FIG. 6A and FIG. 6B, a LSI 601 for processing electric signals, such as a CPM, is mounted on the printed circuit board 101 of the optical module 100. Since it is preferable to shorten the wiring of electric signals on the printed circuit board 101 for attaining high speed transmission, the arrangement of an optical element (light-receiving element 111 or light-emitting element 112) adjacent to the LSI 601 is preferable. It is preferable to mount a heat sink 602 on the LSI 601 to dissipate heat from the LSI 601.

The optical module 100 may be desirably not more than 3 mm in overall height even in the case of mounting the heat sink 602 on the LSI 601. Thus, it is desirable that the optical module 100 has not more than 1.0 mm in overall thickness h (thickness from the upper surface of the optical element to the lower surface of the optical waveguide 130). In order to attain the optical module 100 of this thickness having an ability of high-speed transmission of 20 G or more, it is preferable to make the thickness of the lens sheet 120 not more than 300 μm. In this regard, as long as the lens sheet 120 is provided with the Fresnel lens 121 as described above, the thickness of the lens sheet 120 may be made thin and the lens sheet 120 may be manufactured by an inexpensive emboss roll method.

Furthermore, according to the configuration illustrated in FIG. 6B, the thickness of the optical module 100 may be made thin. Thus, the heat sink 602 may be extended not only over the LSI 601 but also over the optical elements (light-receiving element 111 and light-emitting element 112), the TIA 113, and the drive IC 114. Therefore, heat may be also dissipated from the optical elements (light-receiving element 111 and light-emitting element 112), the TIA 113, and the drive IC 114.

Figure 7:
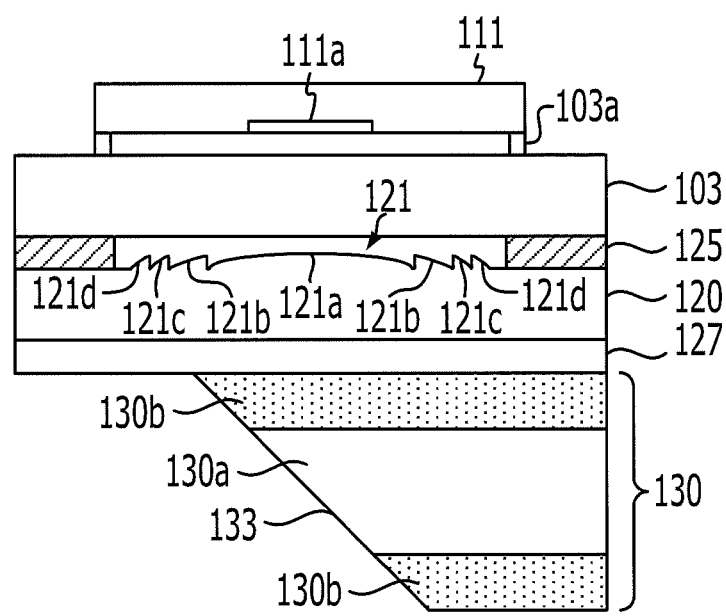
FIG. 7 is a partially expanded sectional view of the optical module according to a third embodiment.

FIG. 7 is a partially expanded sectional view of the optical module according to a third embodiment. The configuration of this optical module is different from the one illustrated in FIG. 2 in that the former employs an optical fiber as an optical waveguide 130. On the end of the optical fiber 130, for example, an inclined cut portion 133 with an inclined angle of 45 degrees is formed on a portion where the optical elements (light-receiving element 111 and light-emitting element 112), and the Fresnel lens 121 are formed. Therefore, in a manner similar to the above mirror 133, the traveling direction of light can be changed 90 degrees. The inclined cutting portion 133 is formed by dicing the optical fiber 130. The optical fiber 130 is preferably one having a thickness of less than 125 μm.

A plurality of optical fibers 130 may be an optical fiber array arranged in the depth direction of the figure and may correspond to a plurality of channels (ch). In this case, for example, a plurality of V-shaped grooves is formed in a substrate, such as a Si substrate, so that the grooves are arranged with a distance corresponding to the space of the channels (ch). Then, optical fibers 130 are embedded in the respective V-shaped grooves to construct an optical fiber array.

Figure 8:
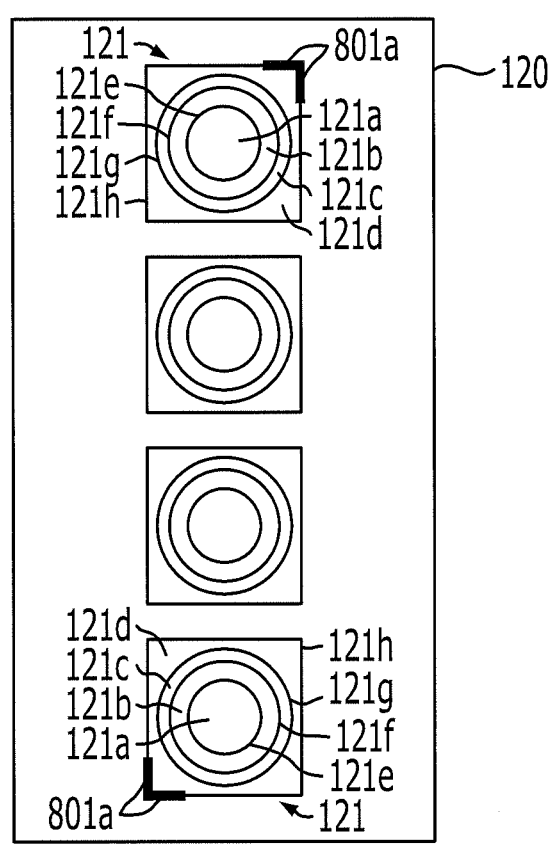
FIG. 8 is a plan view illustrating a lens sheet according to a fourth embodiment.

According to a fourth embodiment, alignment of components is performed using part of the Fresnel lens 121 without forming the aforementioned alignment marks 120a on other portions. FIG. 8 is a plan view illustrating a lens sheet according to the fourth embodiment. In the fourth embodiment, any of boundary surfaces 121e to 121h, which are steps located at the boundaries of a first zone 121a to a fourth zone 121d formed on the Fresnel lens 121, is employed as an alignment mark for the alignment. The first zone 121a to the third zone 121c are circular lenses when viewed from the upper surface. However, the profile of the fourth zone 121d is a rectangular shape. Making the profile of the fourth zone 121d rectangular, the corners and sides of the rectangular zone facilitate the alignment, compared with a circular zone. Therefore, the outermost boundary surface 121h, which is a step formed in rectangle is used as an indicator in the alignment.

Further description will be made in detail with reference to the example illustrated in FIG. 8. Among a plurality of Fresnel lenses 121, the boundary surfaces 121h of the outermost sides (edges) of two outermost Fresnel lenses 121 are used. The alignment does not employ all the sides of the boundary surface 121h, only some of them. Only parts of generally angled brackets on upper and lower positions as represented by the reference numeral 801a in the figure. The profile of the positioning part 801a has the same shape as that of the alignment mark 120b when viewed from the upper surface. In the figure, the positioning parts 801a are represented by thick lines for convenience. In fact, however, the lines may not be of thick.

The structure as described above has the following advantages:

1. Production of a die for lens formation is made easy because the use of the Fresnel lens 121 allows the formation of a configuration equivalent to the alignment mark 120b.

2. Positional accuracy between the apex of the Fresnel lens 121 and the edge portion (boundary surface 121h) may be improved to almost several micrometers because the distance between the apex of the Fresnel lens and the edge portion may be decreased by the above item 1 (50 μm to 250 μm). Therefore, positioning accuracy at the time of mounting optical elements (light-receiving element 111 and light-emitting element 112) may be improved.

In the above configuration, the boundary surface 121h of the fourth zone 121d to be used for the alignment is in the form of a square (rectangular) shape. Alternatively, the boundary surface 121h may be in the form of a polygonal shape instead of the square shape and the polygonal shape zone may be used similarly.

Alignment at the Time of Manufacture in Fourth Embodiment

Figure 9A:
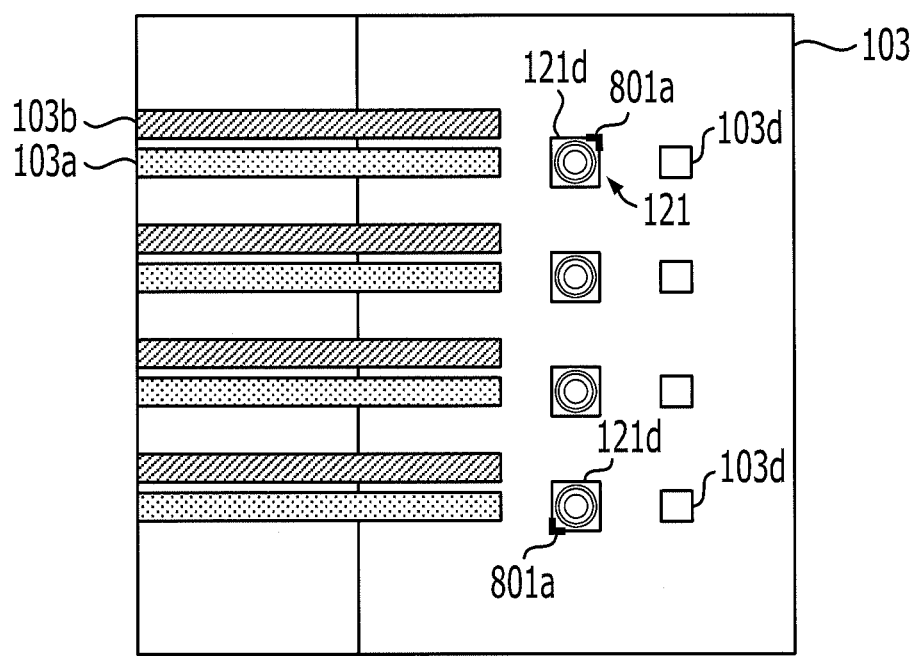
FIG. 9A and FIG. 9B are diagrams each illustrating another exemplary flip-chip bonding.
Figure 9B:
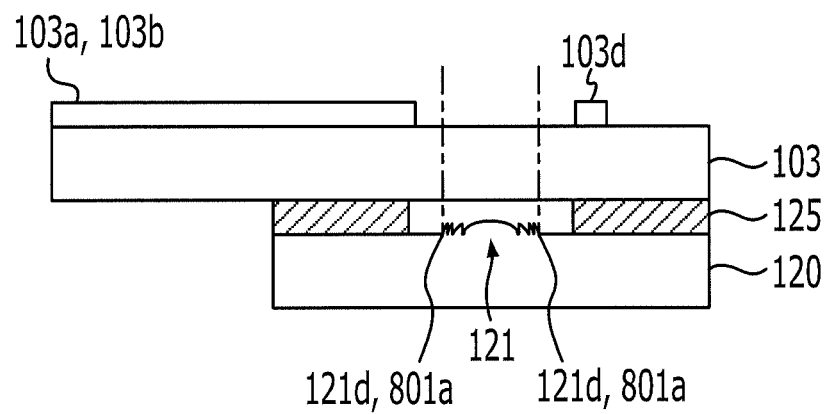

Next, alignment at the time of mounting an optical element using the lens sheet 120 illustrated in FIG. 8 will be described. FIGS. 9A and 9B are diagrams each illustrating another exemplary flip-chip bonding. In this example, as illustrated in the plan view of FIG. 9A, the positioning part 801a of the boundary surface 121h of the Fresnel lens 121 on the lens sheet 120 in the fourth zone is used as an alignment indicator. FIG. 9B is a side view illustrating the lens sheet 120.

Figure 9C:
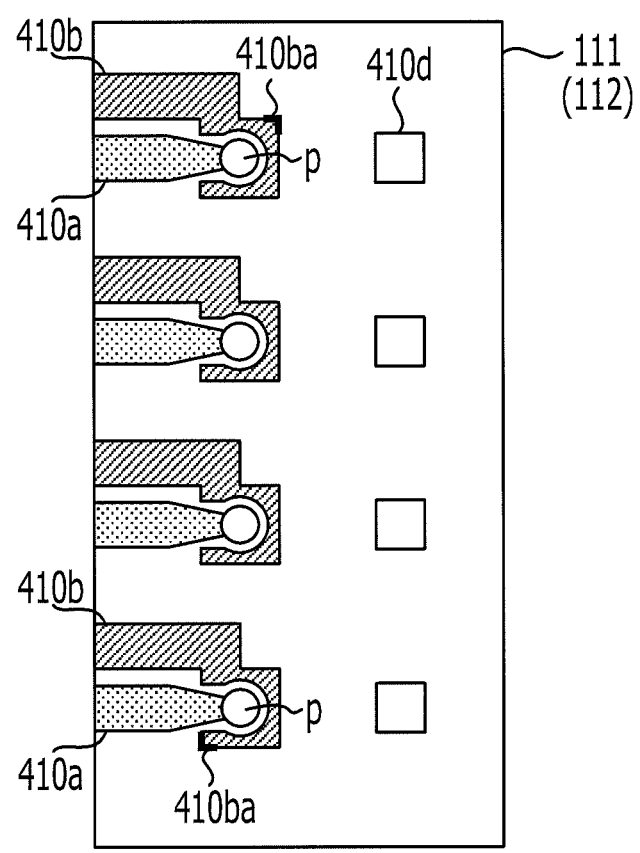
FIG. 9C is a diagram illustrating the under side of the optical element viewing from the upper side thereof.

FIG. 9C is a diagram illustrating the optical element. FIG. 9C is a diagram illustrating the under side of the optical element viewed from the upper side thereof. On the lower surface (electrode surface) of the optical element, as illustrated in FIG. 9C, a part of the side of the earth electrode 410b serves as a positioning part 410ba for the alignment. The earth electrode 410b is formed in advance to have the same profile as the positioning part 801a. The earth electrode 410b is positioned with reference to the center position of the light-receiving element 111 or the light-emitting element 112 ("p" in the figure), or the center position of the light-receiving surface of the light receiving chip. The earth electrodes 410b are aligned with respect to the center position ("p" in the figure) of the light-receiving element 111 or the light emitting device 112. In other words, the earth electrodes 410b are formed in a rectangular shape around light-receiving element 111 or the light emitting device 112, respectively, after being aligned with respect to the center positions of the light receiving surface of a light receiving chip in the light-receiving element 111 and the light emitting surface of a light emitting chip in the light emitting device 112.

The positioning parts 801a formed on the lens sheet 120 have the same size and space as those of the positioning parts 410ba formed on the lower surface of the optical element. Therefore, the optical element may be aligned with the lens sheet 120 by mutually fitting two portions located on the upper and lower positions illustrated FIGS. 9A and 9C. As described above, the alignment may be similarly performed using the flip-chip bonder on which the microscope 401 and the half mirror 402 are mounted.

According to this method, the positional accuracy of electrodes to be formed on the light-receiving element 111 and the light-emitting element 112, which are semiconductors, is 1 µm or less. Thus, the positioning part 410ba may be formed substantially with the same accuracy. In addition, as described above, the boundary surface 121h of the fourth zone that constitutes the Fresnel lens 121 of the lens sheet 120 may be formed with high accuracy at the time of forming the lens sheet 120. Therefore, the alignment at the time of mounting the optical element may be performed using the positioning parts 410ba and the positioning parts 801a with high precision.

Figure 9D:
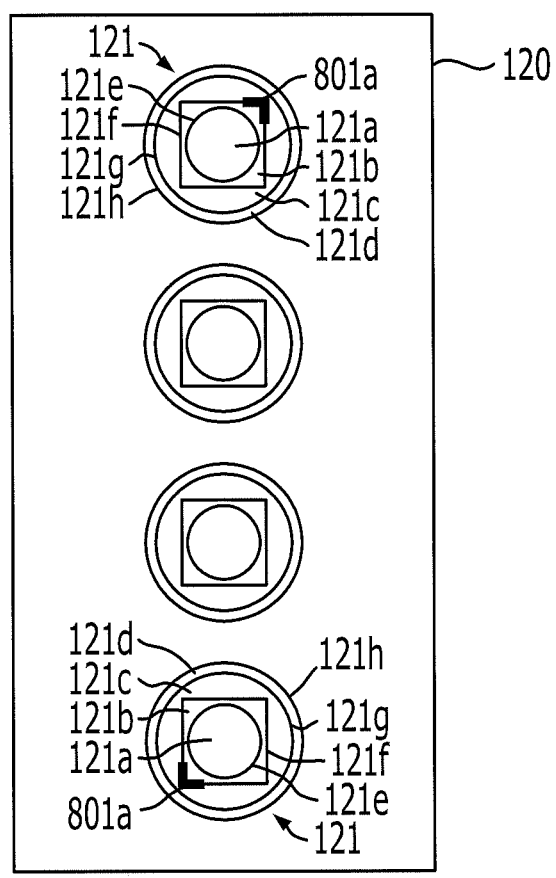
FIG. 9D is a plan view illustrating another exemplary lens sheet according to the fourth embodiment.

Next, FIG. 9D is a plan view illustrating another exemplary lens sheet according to the fourth embodiment. Compared with the lens sheet illustrated in FIG. 8, the lens sheet 120 employs another boundary surface for the alignment. In FIG. 9D, the boundary surface 121f between the second zone 121b and the third zone 121c is used for the alignment. Among the boundary surfaces, only the boundary surface 121f is formed of a square (rectangle). Then, part of the boundary surface 121f, which is in the form of a generally angled bracket, is used as the positioning part 801a.

Thus, any boundary surface may be used for the positioning part 801a of the Fresnel lens 121. In this case, the positioning part 801a of the Fresnel lens 121 may have the same size and space as those of the positioning part 410ba formed on the under surface of the optical element (light-receiving element 111 or light-emitting element 112). In addition, even if the arrangement positions are different from each other, their own barycentric positions may be obtained and if their barycentric positions and angles coincide with each other, they may be collectively positioned.

A fifth embodiment is different from the above embodiment in that the earth electrode of the circuit board 103 is deformed. An electrode structure is preferably a micro-strip line structure for allowing the circuit board 103 comprised of FPC to transmit high-frequency electric signals with low loss. In this case, an earth electrode (ground) 103b is formed on the entire under surface of the circuit board 103.

Figure 10A:
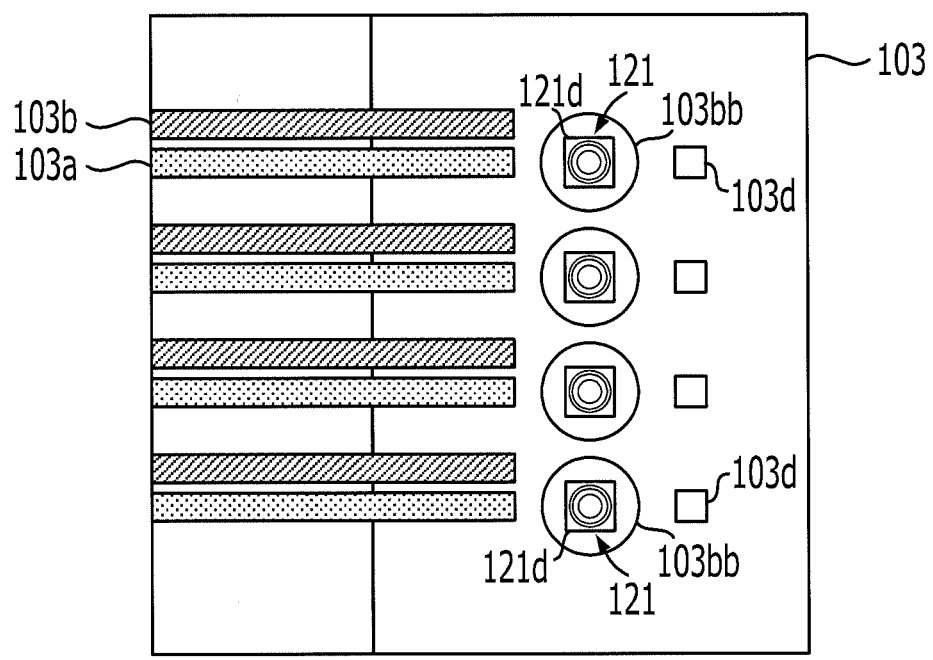
FIG. 10A and FIG. 10B are explanatory diagrams each illustrating exemplary flip-chip bonding according to a fifth embodiment.
Figure 10B:
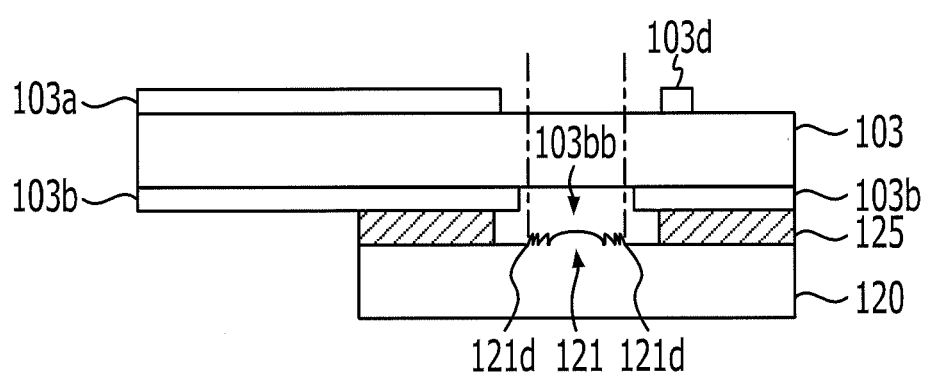

FIGS. 10A and 10B are explanatory diagrams each illustrating exemplary flip-chip bonding according to the fifth embodiment. FIG. 10A is a top view viewed from the upper surface and FIG. 10B is a side view. As illustrated in FIG. 10B, an earth electrode 103b is formed on the lower surface of the circuit board 103. To satisfy good high frequency characteristics, the earth electrode 103b is formed on the lower surface of the circuit board 103 so to be formed comparatively wider on the backside area corresponding to the area where at least a surface signal electrode 103a is formed. However, the earth electrode 103b does not transmit light, so that portion thereof where light from the optical element (light-receiving element 111 or the light-emitting element 112) passes may form an opening 103bb. The opening 103bb illustrated in FIG. 10A is in the form of a circle and formed larger than at least the profile of the Fresnel lens 121. Since the circuit board 103 is transparent, the earth electrode 103b is seen as illustrated in FIG. 10A.

The boundary surface 121h described in the fourth embodiment may be used as a positioning part 801a for the Fresnel lens 121 formed on the lens sheet 120. The Fresnel lens 121 is aligned with the optical axis of the optical element in a manner similar to the one described above.

Figure 11:
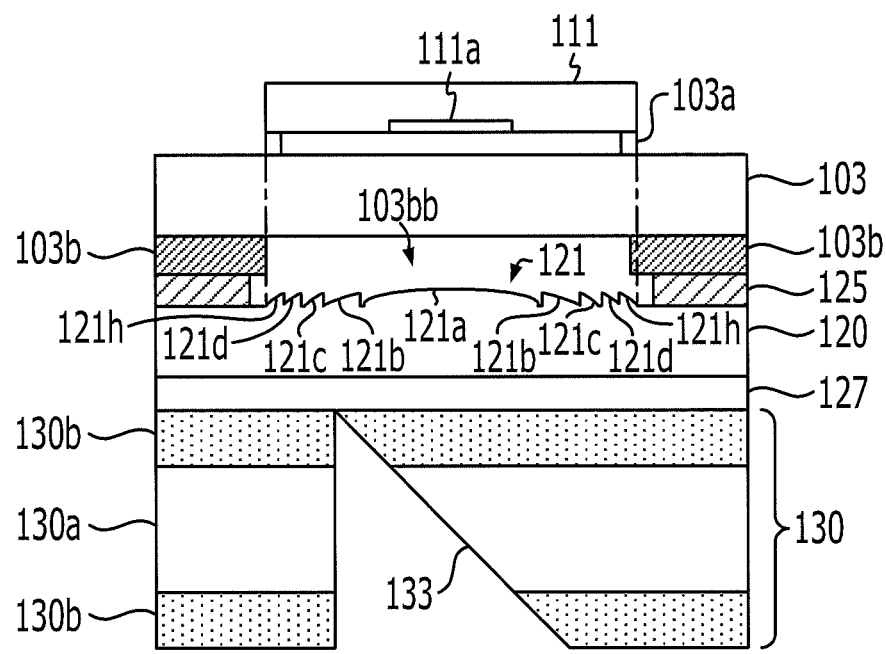
FIG. 11 is a partially enlarged sectional view of an optical module.

The opening 103bb of the aforementioned earth electrode 103b may be used for alignment between the circuit board 103 and the optical element. FIG. 11 is a partially enlarged cross-sectional view of the optical module. As illustrated in FIG. 11, the opening 103bb of the earth electrode 103b is formed in the shape of a rectangle so that the profile thereof corresponds to the profile of the optical element (light-receiving element 111 and the light-emitting element 112). Therefore, as illustrated in FIG. 11, the position of the light-receiving element 111 is fit to the position of the opening 103bb of the earth electrode 103b formed on the circuit board 103.

Figure 12B:
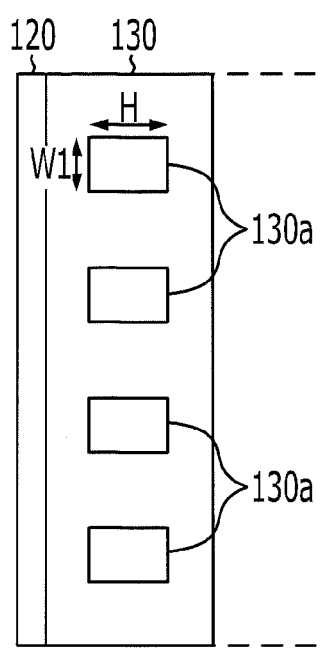
FIG. 12A and FIG. 12B are diagrams illustrating a Fresnel lens according to a sixth embodiment.
Figure 12A:
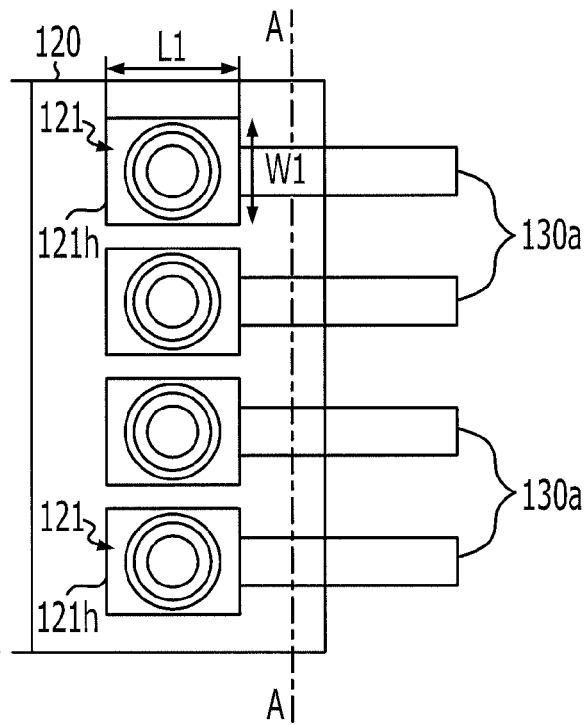

A sixth embodiment is an exemplary configuration that makes a correlation between the shape of an optical waveguide and the shape of a Fresnel lens. FIG. 12A and FIG. 12B are diagrams illustrating a Fresnel lens according to the sixth embodiment. FIG. 12A is a plan view and FIG. 12B is a cross-sectional view along line A-A in FIG. 12A. As illustrated in FIG. 12B, when the cross-sectional profile of the core 130a of the waveguide 130 is a square, the profile of the outermost boundary surface 121h of the Fresnel lens 121 may have substantially the same square shape as that of the core 130a to improve an optical coupling efficiency.

As illustrated in FIG. 12B, in the case that the cross-sectional profile of the waveguide 130 is a rectangle (width W1 and height H), the Fresnel lens 21 has the width and height corresponding to those of the waveguide when viewed from the upper surface. The Fresnel lens 121 is, for example, a rectangle having a width W1 and a length L1. An optical signal beam output from a rectangular waveguide 130 spreads out in a rectangular form. Thus, a light-condensing efficiency is improved by adjusting the profile of the Fresnel lens 121 to this rectangular shape.

Figure 13:
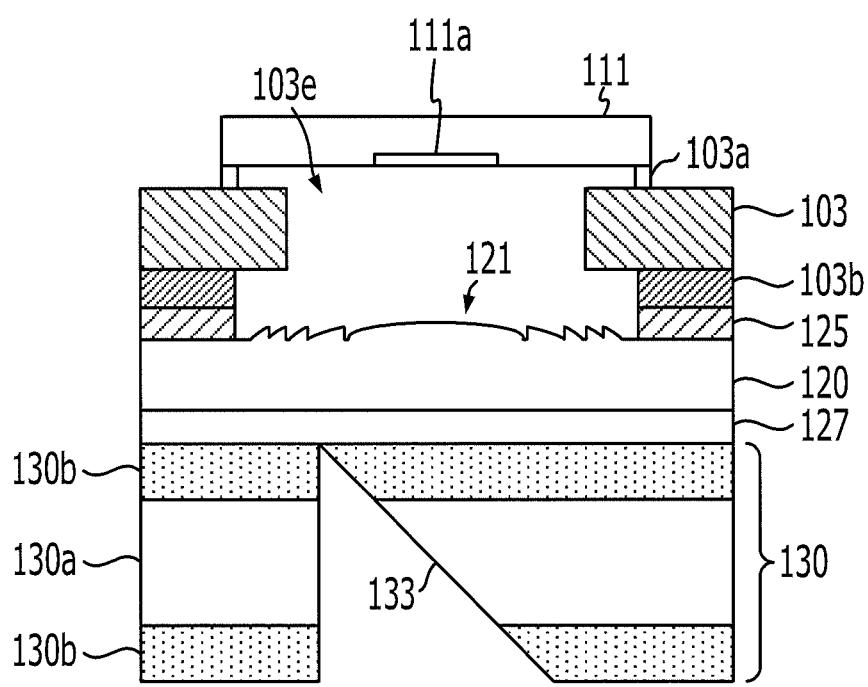
FIG. 13 is a partially enlarged cross-sectional view illustrating a configuration of an optical module using an opaque circuit board according to a seventh embodiment.

In a seventh embodiment, a configuration for changing the material of the above circuit board to correspond to high frequency will be described. FIG. 13 is a partially enlarged cross-sectional view illustrating a configuration of an optical module using an opaque circuit board according to the seventh embodiment. For the optical module, for example, the material of the circuit board 103 may be preferably a liquid crystal polymer (LCP) instead of polyimide to cope with a high frequency of 40 G or more. The LCP is opaque and does not permeate light. Thus, as illustrated in FIG. 13, a passage hole 103e may be preferably formed in a portion of the circuit board 103 through which a signal light beam passes. According to an aspect of an embodiment, an alignment mark is an edge of the opening 103e in the circuit board 103.

Figure 14:
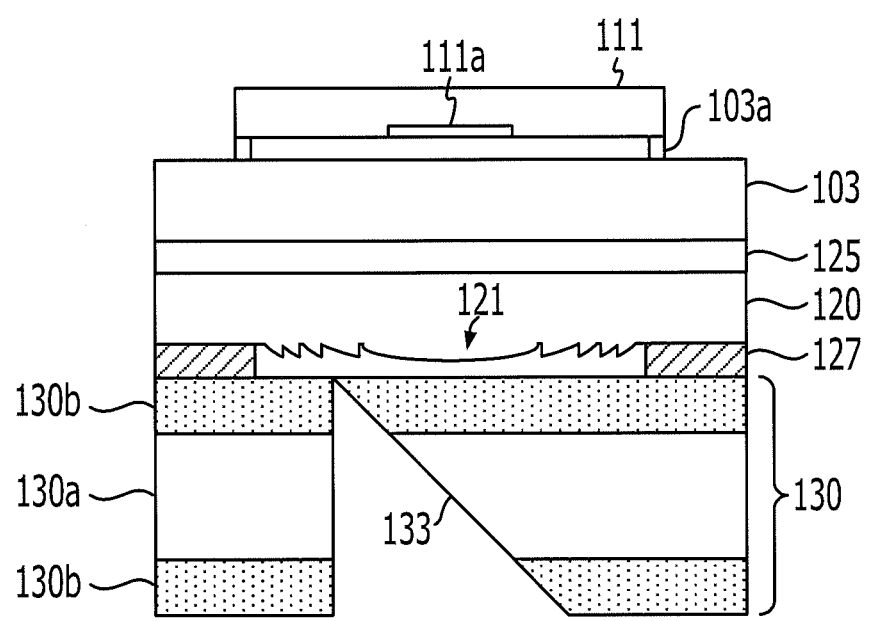
FIG. 14 is a partially enlarged sectional view of an optical module using a lens sheet according to an eighth embodiment.

FIG. 14 is a partially enlarged sectional view of an optical module using a lens sheet according to an eighth embodiment. The lens sheet 120 is transparent and thin. Thus, the convex surface of the Fresnel lens 121 is not only limited to a surface extending upward. Alternatively, the convex surface may extend downward as illustrated in the figure. The convex surface of the Fresnel lens 121 faces the circuit board 103. In this case, a bonding layer 127 formed on the convex surface side is attached by an adhesive using a spacer having a predetermined height corresponding to the height of the convex surface. Since the thickness of the Fresnel lens 121 is small, the thickness of the bonding layer 127 may be made thin. Instead of the bonding layer 127, an adhesion layer having a predetermined height may be used. The adhesion between the lens sheet 120 and the circuit board 103 may be attained using a transparent adhesion sheet 125 or an adhesive agent.

Figure 15:
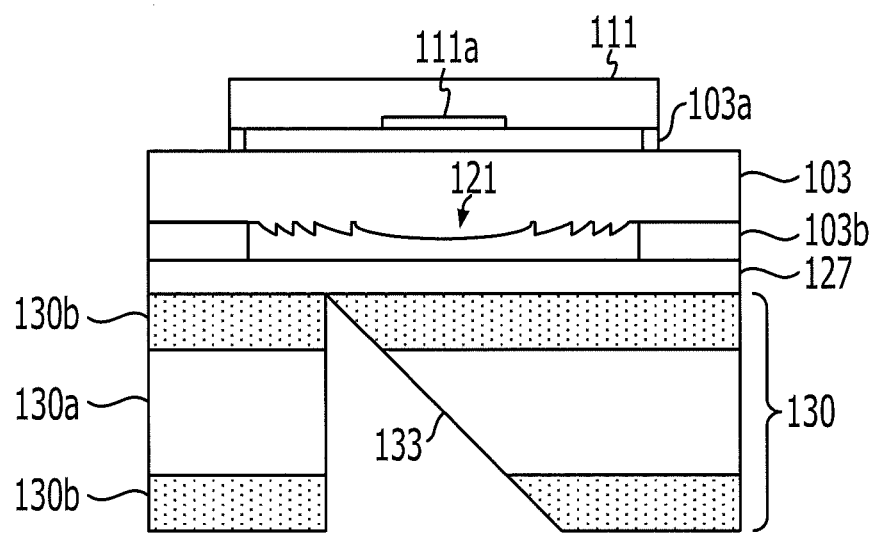
FIG. 15 is a partially enlarged diagram illustrating an optical module according to a ninth embodiment.

FIG. 15 is a partially enlarged diagram illustrating an optical module according to a ninth embodiment. A circuit board 103 illustrated in FIG. 15 is a transparent member, and a Fresnel lens 121 is formed on part of the circuit board 103. A signal electrode 103a is formed on the surface of the circuit board 103 and an earth electrode 103b is formed on the backside thereof. Therefore, there is no need to separately use a lens sheet 120. According to an aspect of an embodiment, an alignment mark is on the circuit board (unit) that serves as an indicator for alignment of the one or more lenses with the one or more optical elements. Alternatively, the optical module may be configured so that electrodes are formed on the lens sheet 120. In this case, the circuit board 103 may be excluded to provide a circuit unit. Thus, the number of structural components may be reduced.

The lens sheet 120 or the circuit board 103 on which the Fresnel lens 121 is formed may be, for example, made of COP or polyimide to demonstrate excellent electric high frequency characteristics. In the case of COP, the lens may be formed easily. However, there is need of a process for forming an electrode at a low temperature of 150° C. or less. In the case of polyimide, the electrode may be formed easily. However, there is a need of a high temperature of 350° C. or more for the lens formation.

Figure 16:
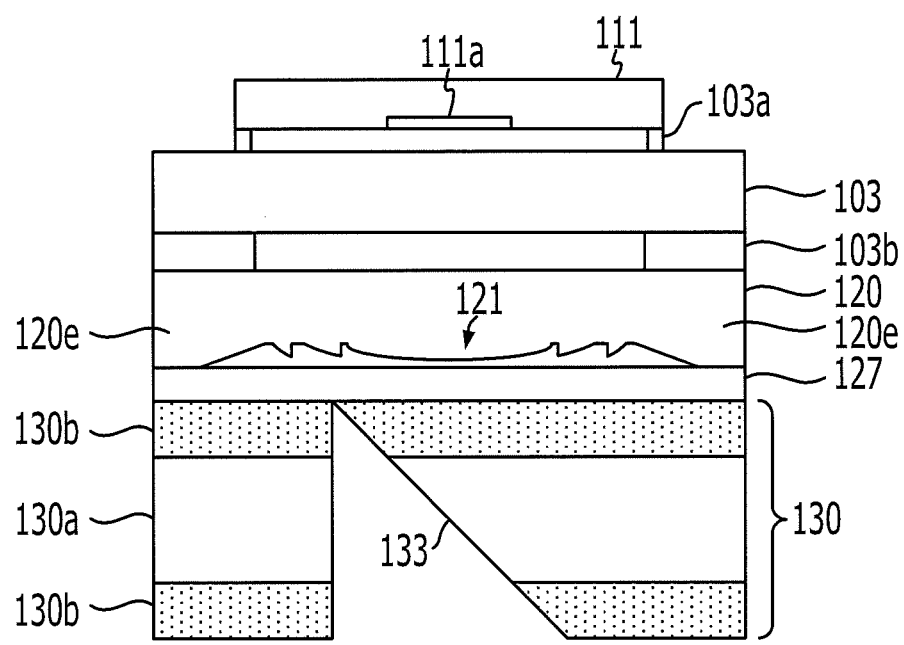
FIG. 16 is a partially enlarged diagram illustrating an optical module according to a tenth embodiment.

FIG. 16 is a partially enlarged diagram illustrating an optical module according to a tenth embodiment. A lens sheet 120 illustrated in FIG. 6 is provided with an outer edge portion 120e around a Fresnel lens 121. The outer edge portion 120e is higher than the convex portion of the Fresnel lens 121. Thus, there is no need to provide a spacer having a height corresponding to the height of the convex portion of the Fresnel lens 121 and to protect the convex surface of the Fresnel lens 121. The bonding layer 127 is an adhesion sheet or a double-sided tape, which is transparent and substantially constant in thickness.

Figure 17:
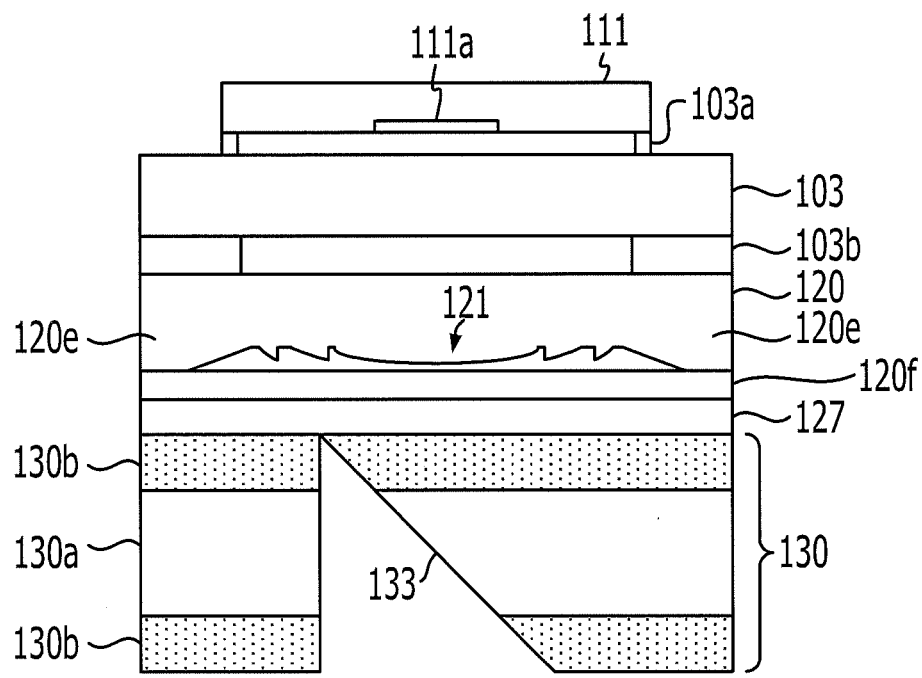
FIG. 17 is a partially enlarged diagram illustrating another configuration of the optical module according to the tenth embodiment.

FIG. 17 is a partially enlarged diagram illustrating another configuration of the optical module according to the tenth embodiment. In this case, a flat protective lens sheet 120f is attached on the convex surface of the lens sheet 120 having the outer edge portion 120e illustrated in FIG. 16. The lens sheet 120f may be, for example, made of the same material as that of the lens sheet 120. For example, in the case of using COP, it is possible to directly bond two lens sheets 120 and 120f together at about 75° C. after washing with oxygen plasma. Then, the lens sheet 120f covers the convex portion of the lens sheet 120 as if to serve as a cover and flattens the entire lens sheet 120. Thus, handling is made easier. Additionally, a gelled type bonding layer 127 may be used for attachment. Therefore, even if the gelled bonding layer 127 is used, the gelled bonding layer 127 does not flow into the convex portion of the Fresnel lens 121.

Figure 18:
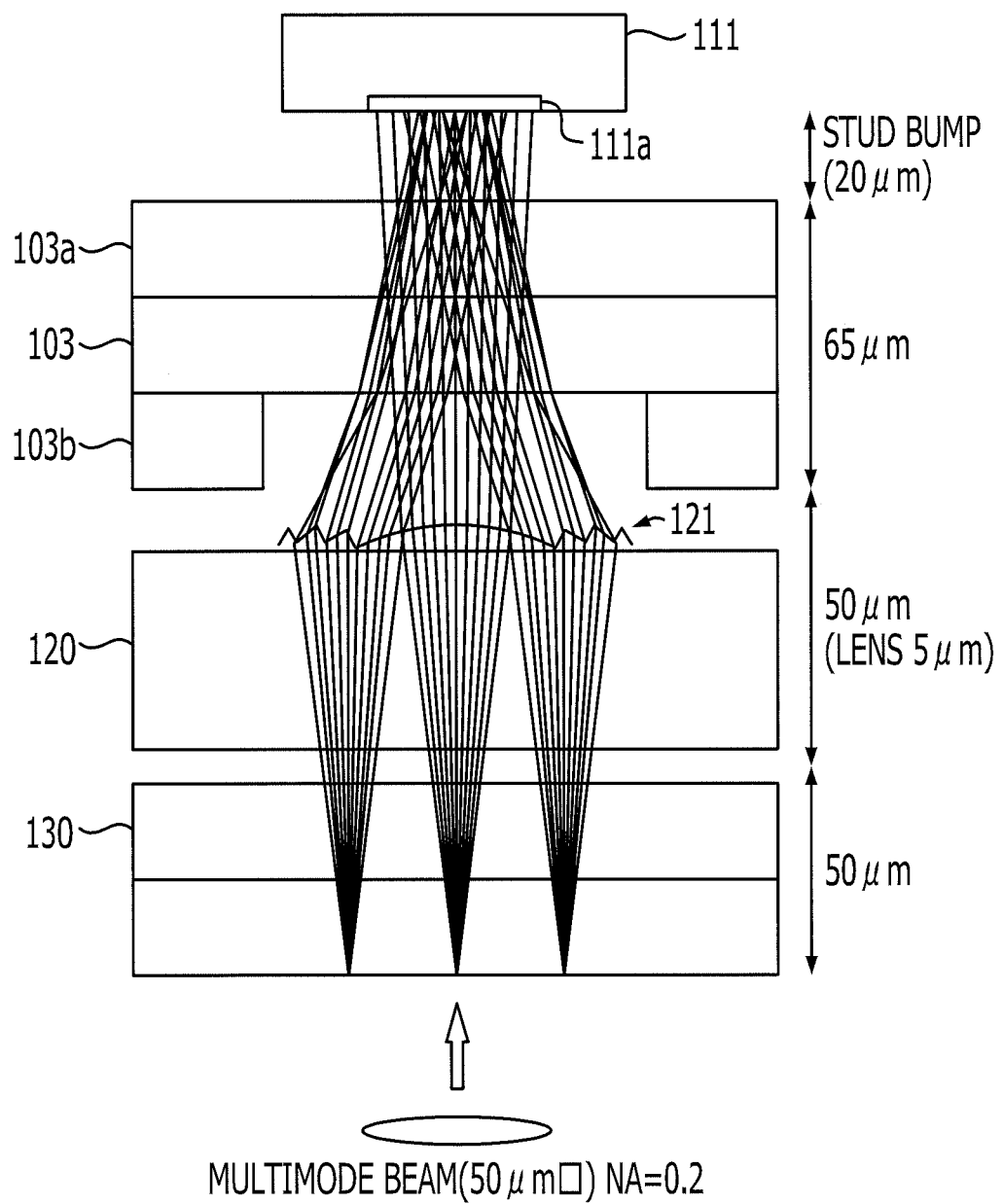
FIG. 18 is a diagram illustrating a simulation result of an optical beam model of optical signal in an optical module according to an embodiment.

According to the configuration of the optical module described in the above embodiment, a high-speed optical module of not less than 20 GBps may be provided using a low-cost manufacturing process. FIG. 18 is a diagram illustrating a simulation result of an optical beam model of an optical signal in an optical module according to an embodiment. In the simulation, the exemplary configuration of the optical module illustrated in FIG. 11 is used. An incident optical signal is a multimode beam (beam diameter=50 μm and NA=0.2). The lens sheet 120 is 50 μm in thickness and the Fresnel lens 121 is 5 μm in height. The circuit board 103 used is one having a thickness of 65 μm and having electrodes on both sides thereof. A stud bump of the light-receiving element 111 is 20 μm in thickness and the light receiving diameter of the light receiving surface 111a of the light-receiving element 111 is 50 μm. Thus, as illustrated in FIG. 18, a ray tracing method with a changed optical axial position of an optical signal was simulated and an improvement effect of the light-receiving element 111 was verified.

Figure 19:
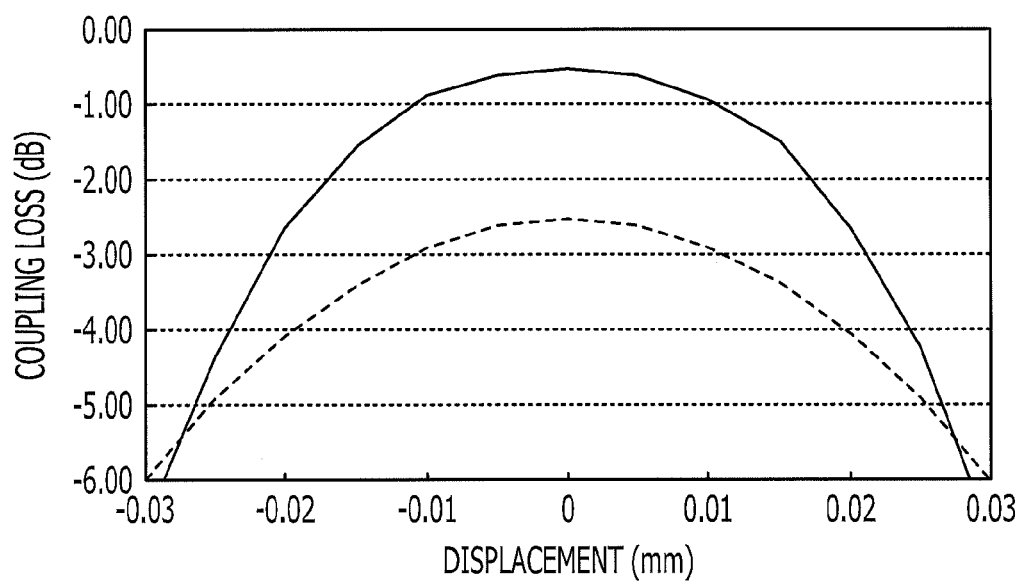
FIG. 19 is a graphic diagram illustrating a change in coupling efficiency with respect to displacement of an optical axis.

FIG. 19 is a graphic diagram illustrating a change in coupling efficiency with respect to displacement of an optical axis. In the case of using the lens sheet 120 described in the above description, an improvement in coupling efficiency is attained in all the regions even in the presence of displacement (solid line), as compared with the case where no lens sheet is formed (dotted line). In the case of no displacement of the optical axis, coupling loss is improved almost 2 dB.

Thus, a light receiving module may be formed using a simple manufacturing process where the formation of the aforementioned lens sheet is added to a prior art manufacturing process in which a light-receiving element and an optical waveguide are mounted on a circuit substrate with a circuit pattern formed thereon. The light receiving module may be produced only by attaching a lens sheet without using any specific processing technology, leading to a reduction in manufacturing costs. Furthermore, alignment marks for alignment are respectively formed on both the lens sheet and the optical element to align them with each other. Therefore, low-loss optical coupling is realizable in an easily manufacturable light-receiving module 100.

Additionally, the aforementioned embodiments have been described while taking light-receiving elements as exemplary optical elements, respectively. However, the aforementioned embodiments are not limited to these examples. Alternatively, the same configurations may be applied to light-emitting elements taken as exemplary optical elements. In the case of an optical module provided with the light-emitting element, the use of the aforementioned lens sheet causes optical signals emitted from the light-emitting element to be efficiently coupled to the optical waveguide.

As described above, according to the optical module and the manufacturing method thereof, a simplified configuration of the optical module and a simplified manufacturing method may lead to an improvement in transmission efficiency.

According to an aspect of the embodiments of the invention, any combinations of one or more of the described features, functions, operations, and/or benefits can be provided. A combination can be one or a plurality. The embodiments can be provided in an apparatus (a machine) that includes hardware to execute instructions, for example, a computing hardware (i.e., computing apparatus), such as (in a non-limiting example) any computer or computer processor that can store, retrieve, process and/or output data and/or communicate (network) with other computers. According to an aspect of an embodiment, the described features, functions, operations, and/or benefits can be implemented by and/or use computing hardware and/or software, for example, control of a mounting device, such as the flip-chip bonder, control of the microscope or camera 401, control of image recognition/processing, control of movement of the mirror 402, etc. For example, a computing, apparatus can comprise a computing controller (CPU) (e.g., a hardware logic circuitry based computer processor that processes or executes instructions, namely software/program), computer readable media, transmission communication interface (network interface), and/or an output device, for example, a display device, and which can be in communication among each other through one or more data communication buses.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiment(s) of the present inventions have been described in detail, it should be understood that the various changes, substitutions, and alterations could be made hereto without departing from the spirit and scope of the invention.

What is claimed is:

1. An optical module comprising:
   a circuit unit provided with one or more optical elements and one or more lenses corresponding to the one or more optical elements formed over a part of the circuit unit, where light from the one or more optical elements pass through the corresponding one or more lenses formed on a lens sheet;
   an alignment mark, formed on the circuit unit, that serves as an indicator for alignment of the one or more lenses formed on the lens sheet with the one or more optical elements, the alignment mark being formed of a depressed portion formed in the lens sheet; and
   an optical waveguide configured to input/output light into/from the optical element through the one or more lenses.

2. The optical module according to claim 1, wherein the circuit board is a flexible printed circuit (FPC) board.

3. The optical module according to claim 1, wherein the lens formed on the lens sheet is a Fresnel lens.

4. The optical module according to claim 3, wherein
   the alignment mark is at least one boundary surface of a plurality of zones that form the Fresnel lens,
   the one boundary surface of the Fresnel lens has a rectangular flat surface, and
   the alignment mark and a rectangular indicator formed on the optical element are aligned with each other.

5. The optical module according to claim 4, wherein the optical waveguide includes a core that is square in cross section, and
   the alignment mark is square so as to correspond to the shape of the core.

6. The optical module according to claim 5, wherein at least an outermost zone among the plurality of zones that form the Fresnel lens has same square shape as that of the core of the optical waveguide.

7. The optical module according to claim 1, wherein the optical waveguide is a polymer waveguide and light is propagated in multi-mode.

8. The optical module according to claim 1, wherein conductor patterns are formed on both surfaces of the circuit board.

9. The optical module according to claim 1, wherein the circuit board has an opening in a portion where the light passes through.

10. The optical module according to claim 9, wherein the circuit board is made of an opaque material and the alignment mark is the opening in the circuit board.

11. The optical module according to claim 1, wherein the lens sheet has an outer edge portion around a Fresnel lens, where the outer edge portion is higher than a peak of height of the Fresnel lens.

12. The optical module according to claim 11, wherein a flat lens sheet for covering the Fresnel lens is attached to a convex surface of the lens sheet.

13. The optical module according to claim 1, wherein the alignment mark is configured to be formed on an area of the lens sheet other than an area of the lens.

14. The optical module according to claim 1, wherein the alignment mark is formed on the lens sheet over the circuit unit by imprint.

15. The optical module according to claim 1, wherein the one or more lenses and the lens sheet are a same material.

16. The optical module according to claim 1, the alignment mark formed on a lens sheet over the circuit unit by imprint.

17. The optical module according to claim 1, wherein the alignment mark is configured to be formed on an area of the lens sheet other than areas of the lenses.

18. An optical module comprising:
   a circuit board provided with one or more optical elements selected from a light-receiving element and/or a light-emitting element;
   a lens sheet formed over a back surface facing away from the one or more optical elements of the circuit board and made of a transparent material;
   a lens formed on a part of the lens sheet, where light from the optical element passes through the lens of the lens sheet;
   an alignment mark formed on the lens sheet together with the lens and serving as an indicator for alignment of the lens with the optical element; and
   an optical waveguide configured to input/output light into/from the optical element through the lens
   wherein the alignment mark is formed of a convex portion integrally formed with the lens sheet, or the alignment mark is formed of a depressed portion formed in the lens sheet.

19. A method for manufacturing an optical module that includes an optical waveguide for inputting/outputting transmitted light; a lens sheet converging light incident on/output from the optical waveguide; and a circuit board on which is mounted one or more optical elements selected from a light-receiving element and/or a light-emitting element, which are attached to the lens sheet, where the light-receiving element receives light passing through the lens sheet and the light-emitting element emits light through the lens sheet, the method comprising:
   forming a circuit pattern on the circuit board;
   forming a lens at a position through which the light passes on the lens sheet;
   using an alignment mark formed on the lens sheet together with the lens by imprint, where the alignment mark serves as an indicator for alignment of the lens with the optical element;
   attaching the lens sheet to the circuit board; and mounting the light element on the circuit board by alignment using the alignment mark,
wherein the alignment mark is formed of a convex portion or a depressed portion on the lens sheet.

20. The method according to claim 19, wherein the lens is a Fresnel lens and the alignment mark is at least one boundary surface of a plurality of zones included in the Fresnel lens.

21. An optical module comprising:
a circuit unit provided with one or more optical elements and one or more lenses corresponding to the one or more optical elements formed over a part of the circuit unit, where light from the one or more optical elements pass through the corresponding one or more lenses formed on a lens sheet;
an alignment mark, formed on the circuit unit, that serves as an indicator for alignment of the one or more lenses formed on the lens sheet with the one or more optical elements, the alignment mark being formed of a convex portion integrally formed with the lens sheet; and
an optical waveguide configured to input/output light into/from the optical element through the one or more lenses.

22. The optical module according to claim 21, the alignment mark is formed on the lens sheet over the circuit unit by imprint.

23. The optical module according to claim 21, wherein the alignment mark is configured to be formed on an area of the lens sheet other than areas of the lenses.

24. The optical module according to claim 21, wherein the one or more lenses and the lens sheet are a same material.

* * * * *